United States Patent
Ueda et al.

(10) Patent No.: US 10,632,491 B2
(45) Date of Patent: Apr. 28, 2020

(54) LIQUID EJECTION DEVICE

(71) Applicant: SEKISUI CHEMICAL CO., LTD., Osaka, Osaka (JP)

(72) Inventors: Michihisa Ueda, Osaka (JP); Masumi Honda, Osaka (JP); Naoyuki Morimoto, Osaka (JP); Takanori Inoue, Osaka (JP); Takashi Watanabe, Osaka (JP); Taichi Hamada, Osaka (JP); Ryosuke Takahashi, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 139 days.

(21) Appl. No.: 15/122,365

(22) PCT Filed: Sep. 18, 2015

(86) PCT No.: PCT/JP2015/076653
§ 371 (c)(1),
(2) Date: Aug. 29, 2016

(87) PCT Pub. No.: WO2016/052253
PCT Pub. Date: Apr. 7, 2016

(65) Prior Publication Data
US 2016/0368015 A1    Dec. 22, 2016

(30) Foreign Application Priority Data

Oct. 1, 2014 (JP) .................................. 2014-202796
Oct. 2, 2014 (JP) .................................. 2014-203581
(Continued)

(51) Int. Cl.
*B41J 2/175*    (2006.01)
*B05C 5/00*     (2006.01)
(Continued)

(52) U.S. Cl.
CPC ............ *B05C 5/001* (2013.01); *B05C 5/0204* (2013.01); *B05C 11/1039* (2013.01);
(Continued)

(58) Field of Classification Search
CPC ... B05C 5/001; B05C 5/0204; B05C 11/1039; B05C 11/1042; B41J 2/175;
(Continued)

(56) References Cited

U.S. PATENT DOCUMENTS 4,314,263 A * 2/1982 Carley .................... G01D 15/18
                                                      347/44
4,636,814 A * 1/1987 Terasawa ............. B41J 2/17566
                                                       347/7
(Continued)

FOREIGN PATENT DOCUMENTS

JP    3-135469 A     6/1991
JP    11-512827 A    11/1999
(Continued)

OTHER PUBLICATIONS

Supplementary European Search Report for the Application No. EP 15 846 881.3 dated May 28, 2018.
(Continued)

*Primary Examiner* — Chee-Chong Lee
(74) *Attorney, Agent, or Firm* — Cheng Law Group, PLLC

(57) ABSTRACT

A liquid ejection device (1) comprising: a first tank (2) for retaining a liquid composition; a head (3) for ejecting the liquid composition; a first heater (4) for heating the liquid composition; a first channel (5); a second heater (6) for heating the liquid composition passing through the first channel (5) at a heating temperature higher than that of the first heater (4); a second channel (7); a second pump (8); and a first pump (9), wherein the temperature difference between
(Continued)

the heating temperature of the second heater (6) and the heating temperature of the first heater (4) is 65° C. or less.

15 Claims, 17 Drawing Sheets

(30) Foreign Application Priority Data

Jun. 25, 2015 (JP) .................................. 2015-127291
Jun. 26, 2015 (JP) .................................. 2015-128228

(51) Int. Cl.
| | | |
|---|---|---|
| *H01L 23/00* | (2006.01) | |
| *H01L 21/67* | (2006.01) | |
| *C08L 63/00* | (2006.01) | |
| *C08G 59/42* | (2006.01) | |
| *B05C 5/02* | (2006.01) | |
| *B05C 11/10* | (2006.01) | |
| *H05K 3/00* | (2006.01) | |
| *H05K 3/28* | (2006.01) | |

(52) U.S. Cl.
CPC ........... *B05C 11/1042* (2013.01); *B41J 2/175* (2013.01); *B41J 2/17513* (2013.01); *C08G 59/4215* (2013.01); *C08L 63/00* (2013.01); *H01L 21/6715* (2013.01); *H01L 24/27* (2013.01); *H01L 24/29* (2013.01); *H01L 24/743* (2013.01); *H05K 3/0091* (2013.01); *H01L 2224/27312* (2013.01); *H01L 2224/2919* (2013.01); *H01L 2224/83191* (2013.01); *H01L 2224/83862* (2013.01); *H01L 2224/83874* (2013.01); *H05K 3/285* (2013.01); *H05K 2203/0759* (2013.01); *Y02P 20/123* (2015.11)

(58) Field of Classification Search
CPC ...... B41J 2/17513; H01L 24/27; H01L 24/29; H01L 24/743; H01L 21/6715
USPC ........................................................ 239/128
See application file for complete search history.

(56) References Cited

U.S. PATENT DOCUMENTS

| | | | | |
|---|---|---|---|---|
| 5,473,350 | A | * | 12/1995 | Mader .................. B41J 2/17566 347/7 |
| 5,481,288 | A | * | 1/1996 | Keeling .................... B41J 2/115 347/74 |
| 5,693,887 | A | | 12/1997 | Englund et al. |
| 5,852,244 | A | | 12/1998 | Englund et al. |
| 5,869,766 | A | | 2/1999 | Cucci et al. |
| RE38,300 | E | | 11/2003 | Englund et al. |
| RE38,557 | E | | 7/2004 | Englund et al. |
| 6,869,160 | B2 | * | 3/2005 | West ...................... B41J 2/1707 347/28 |
| 6,935,729 | B2 | * | 8/2005 | De Marco .................. B41J 2/18 347/6 |
| 7,553,004 | B2 | * | 6/2009 | Kachi .................. B41J 2/17556 347/17 |
| 2011/0085004 | A1 | | 4/2011 | Bansyo |
| 2011/0214757 | A1 | | 9/2011 | Igarashi |
| 2011/0242156 | A1 | | 10/2011 | Shimoda |

FOREIGN PATENT DOCUMENTS

| | | |
|---|---|---|
| JP | 2003-1172 A | 1/2003 |
| JP | 2006-267551 A | 10/2006 |
| JP | 2008-238090 A | 10/2008 |
| JP | 2008-243600 A | 10/2008 |
| JP | 2011-185635 a | 9/2011 |
| JP | 5404498 B | 1/2014 |
| JP | 2014-113816 A | 6/2014 |
| JP | 2014-154568 A | 8/2014 |
| KR | 10-2014-0075118 A | 6/2014 |

OTHER PUBLICATIONS

International Search Report for the Application No. PCT/JP2015/076653 dated Dec. 22, 2015.
Written Opinion of the International Searching Authority PCT/ISA/237 for Application No. PCT/JP2015/076653 dated Dec. 22, 2015.
Written Opinion of the International Searching Authority (PCT/ISA/237) for Application No. PCT/JP2015/076653 dated Dec. 22, 2015 (English Translation dated Apr. 13, 2017).
Korean Office Action for the Application No. 10-2016-7022655 dated Aug. 1, 2018.
Taiwanese Office Action for Application No. 104132443 dated Feb. 10, 2020.

* cited by examiner

[FIG. 1]
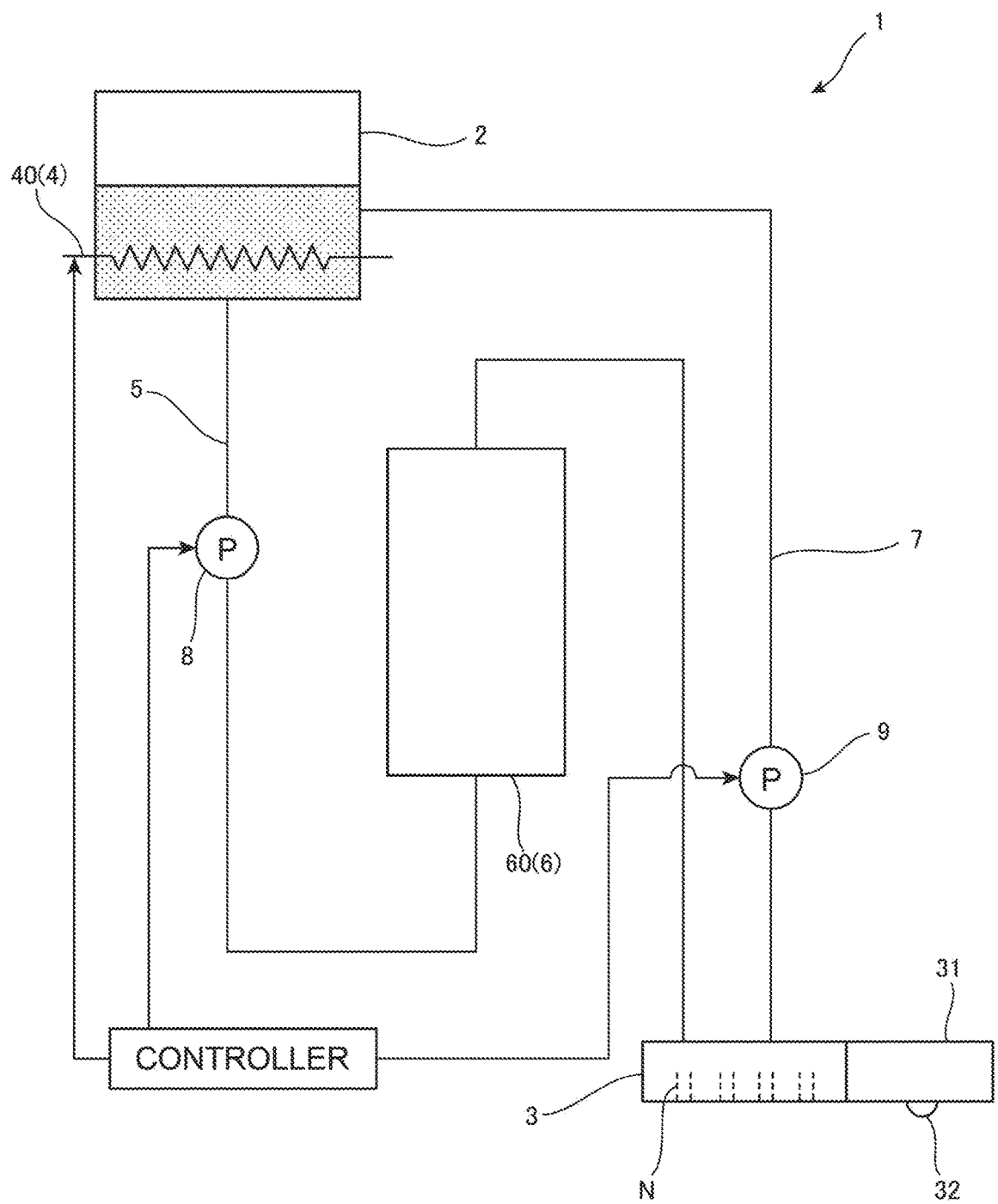

[FIG. 2]
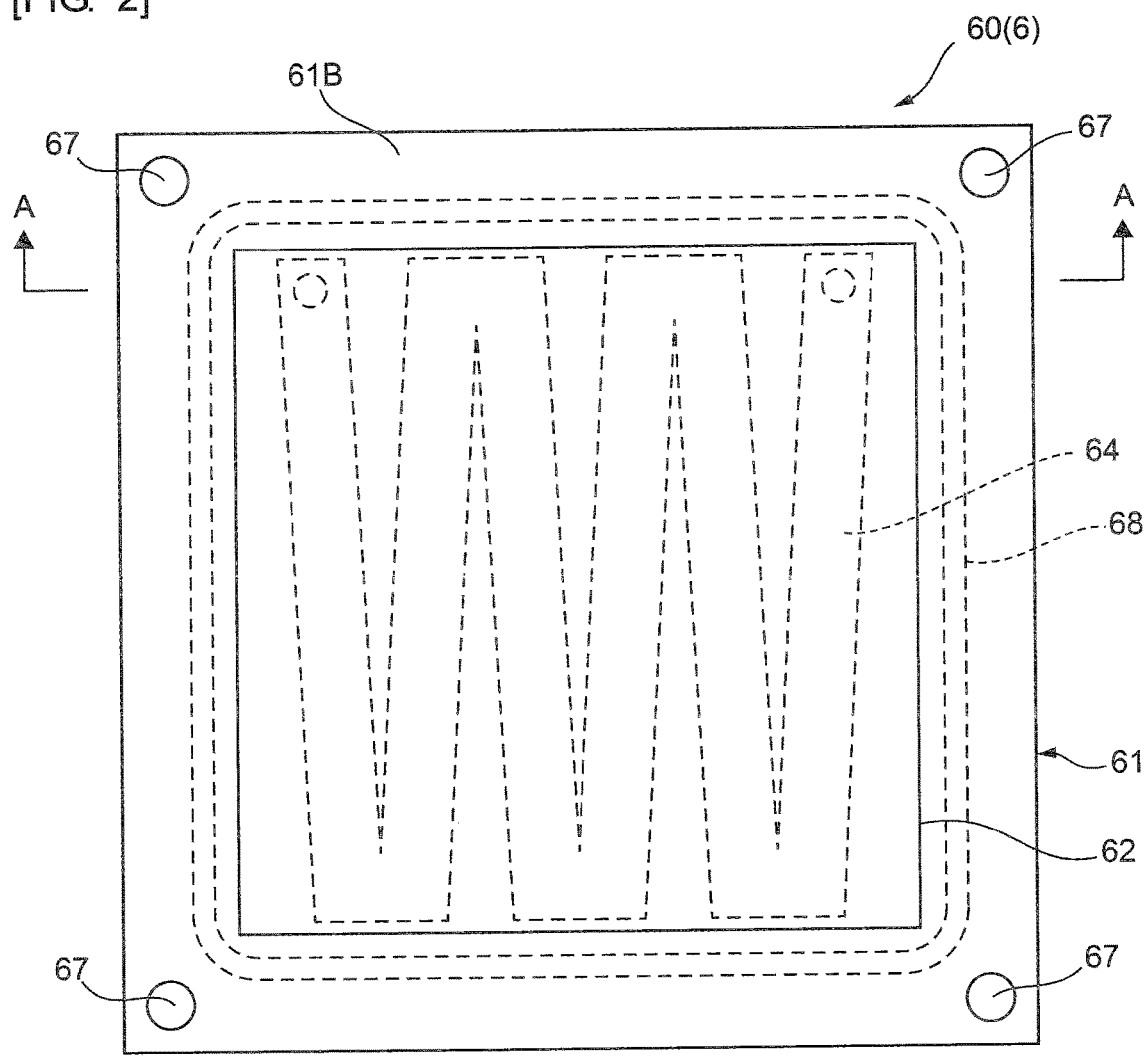
[FIG. 3]
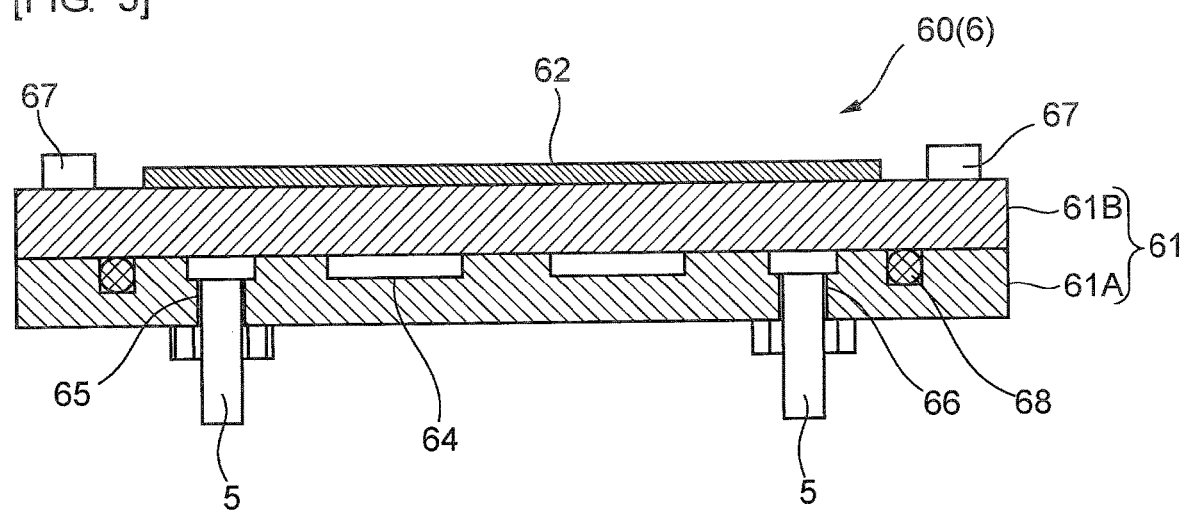

[FIG. 4]
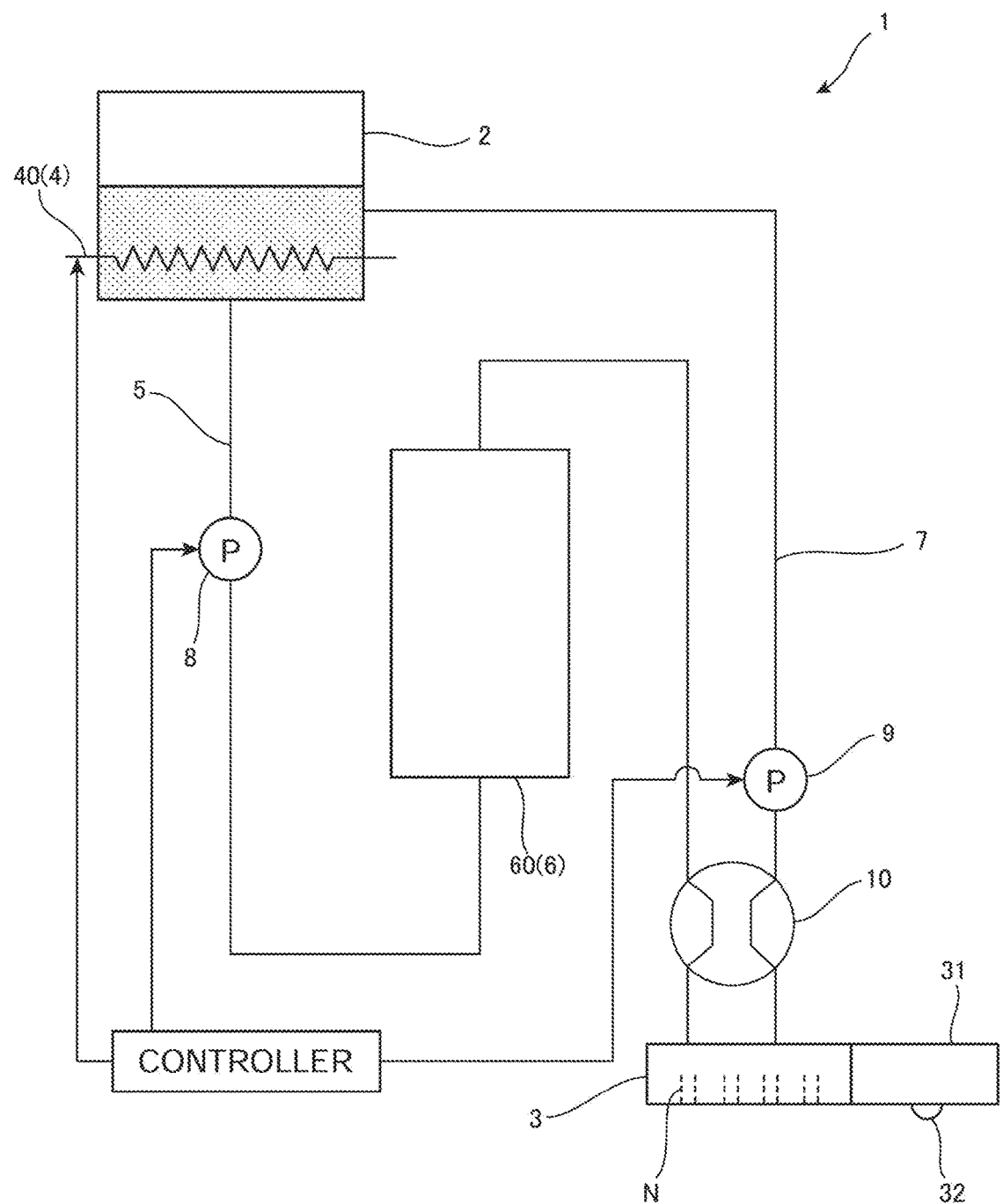

[FIG. 5]
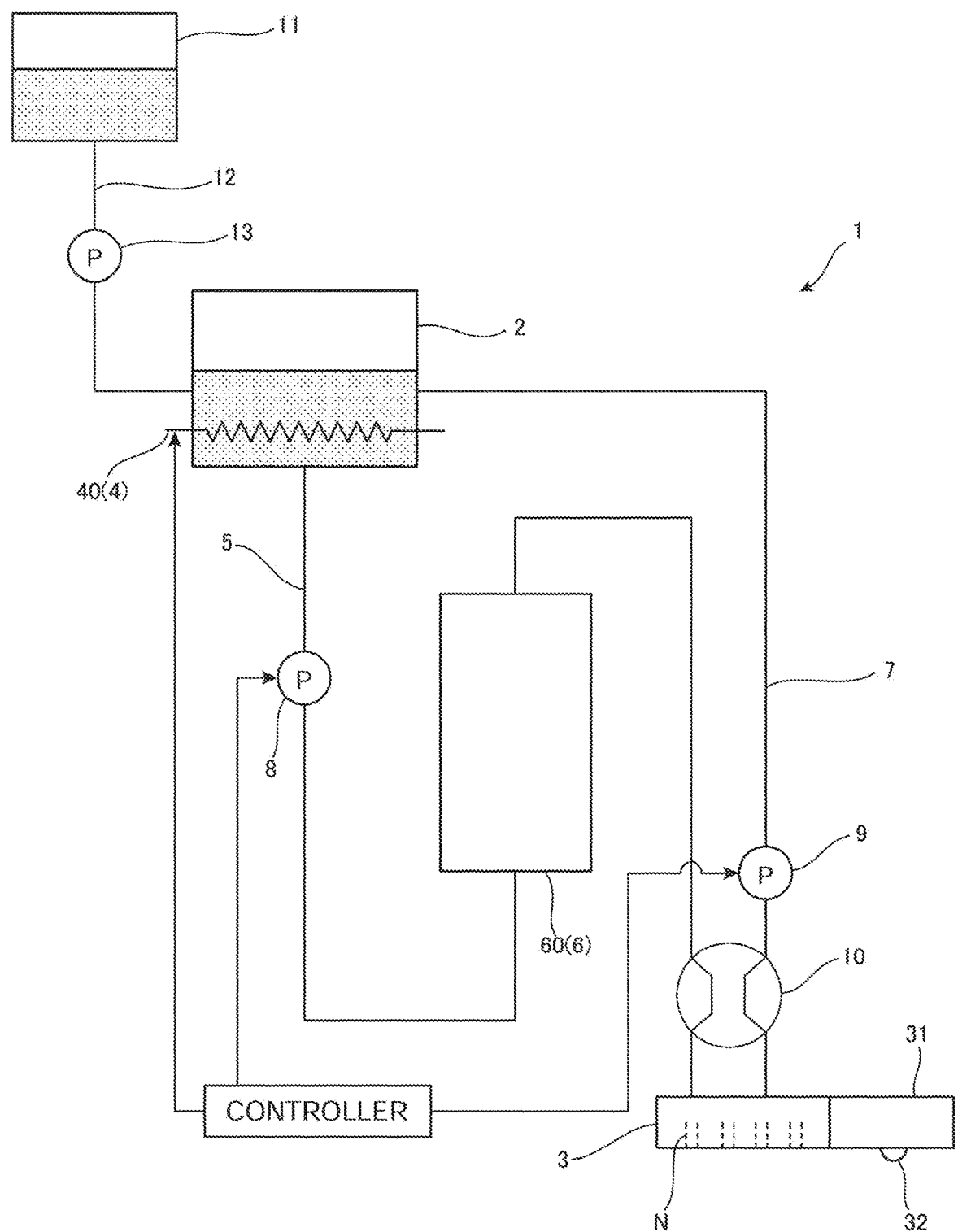

[FIG. 6]
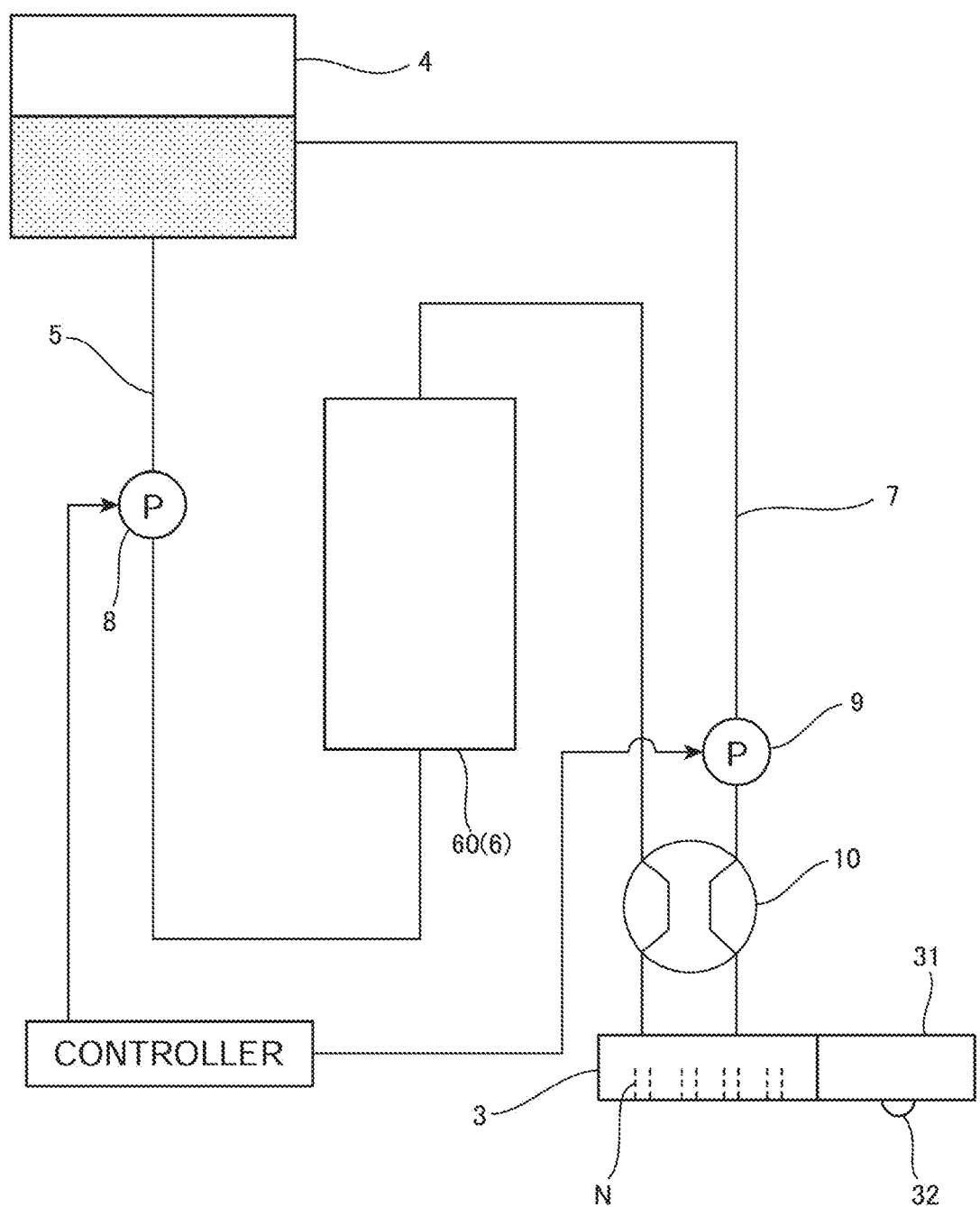

[FIG. 7]
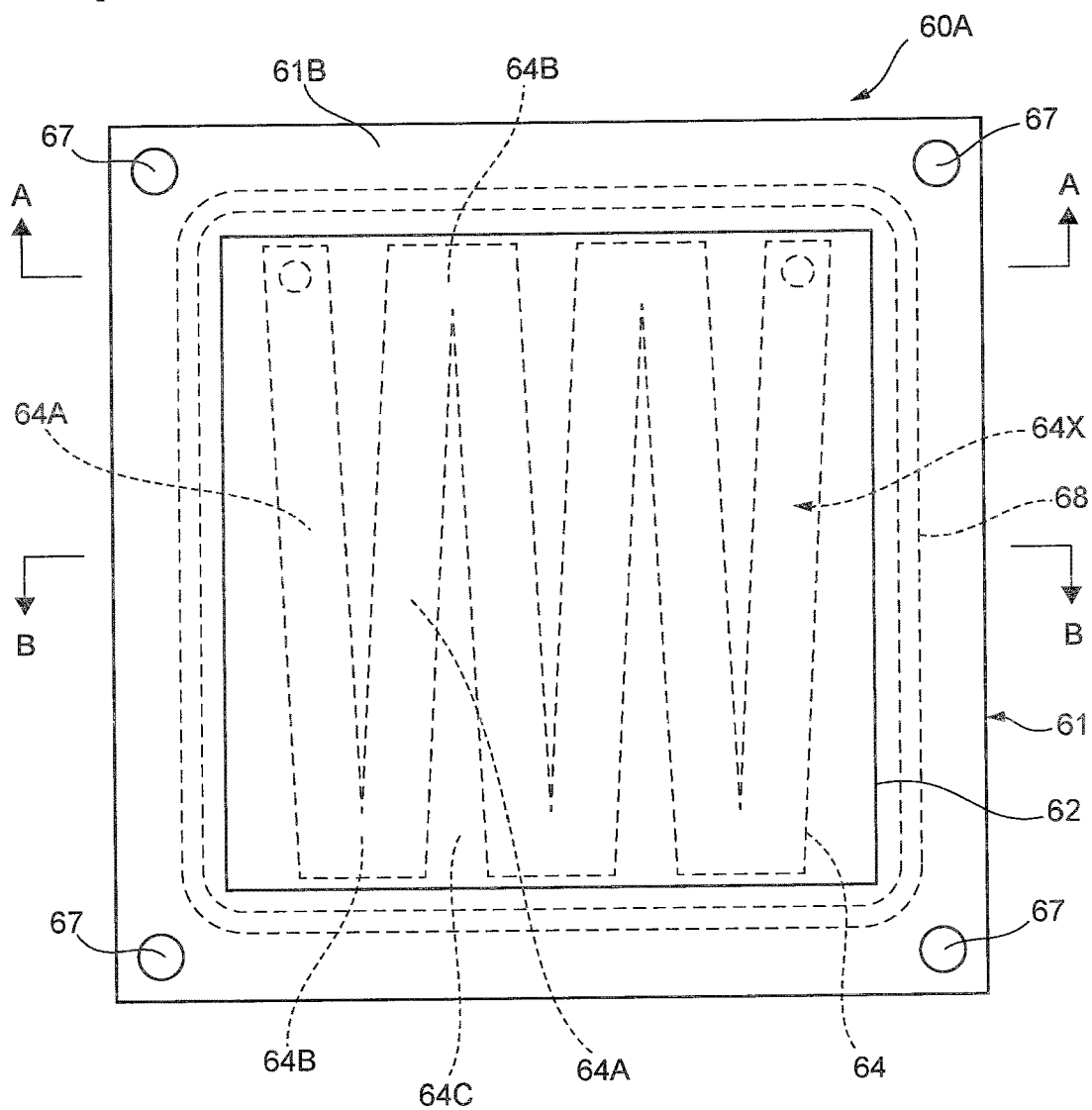
[FIG. 8]
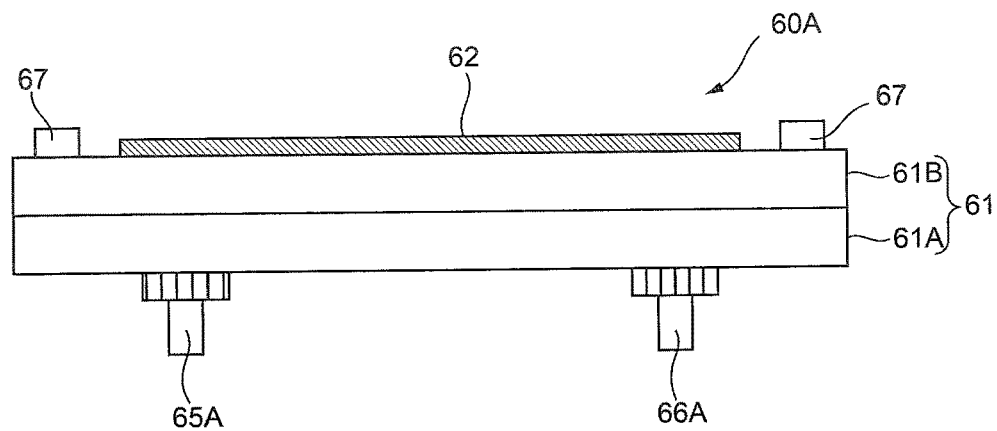

[FIG. 9]
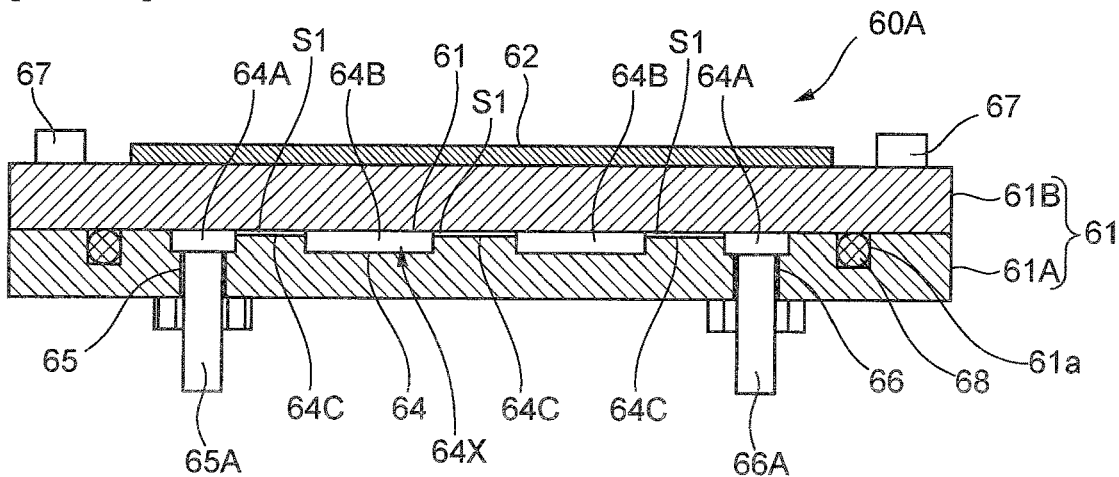
[FIG. 10]
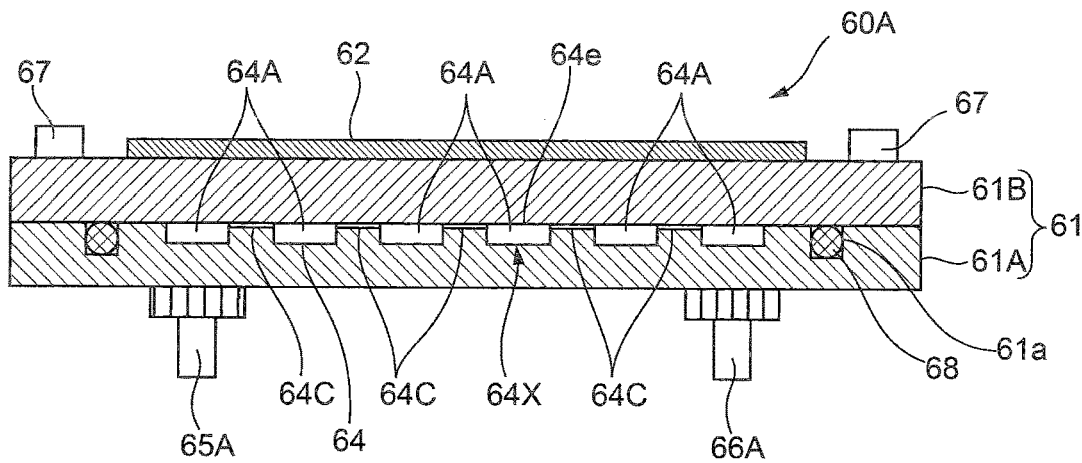
[FIG. 11]
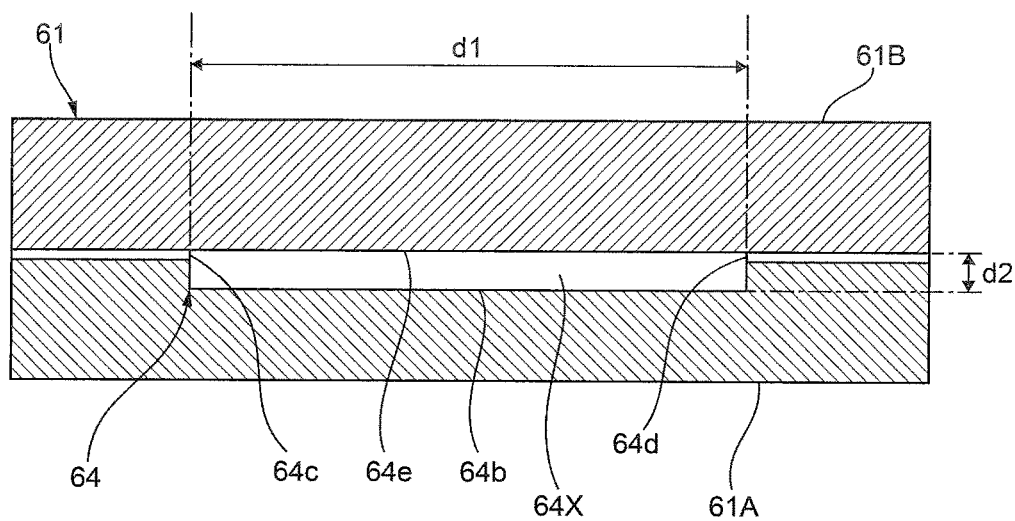

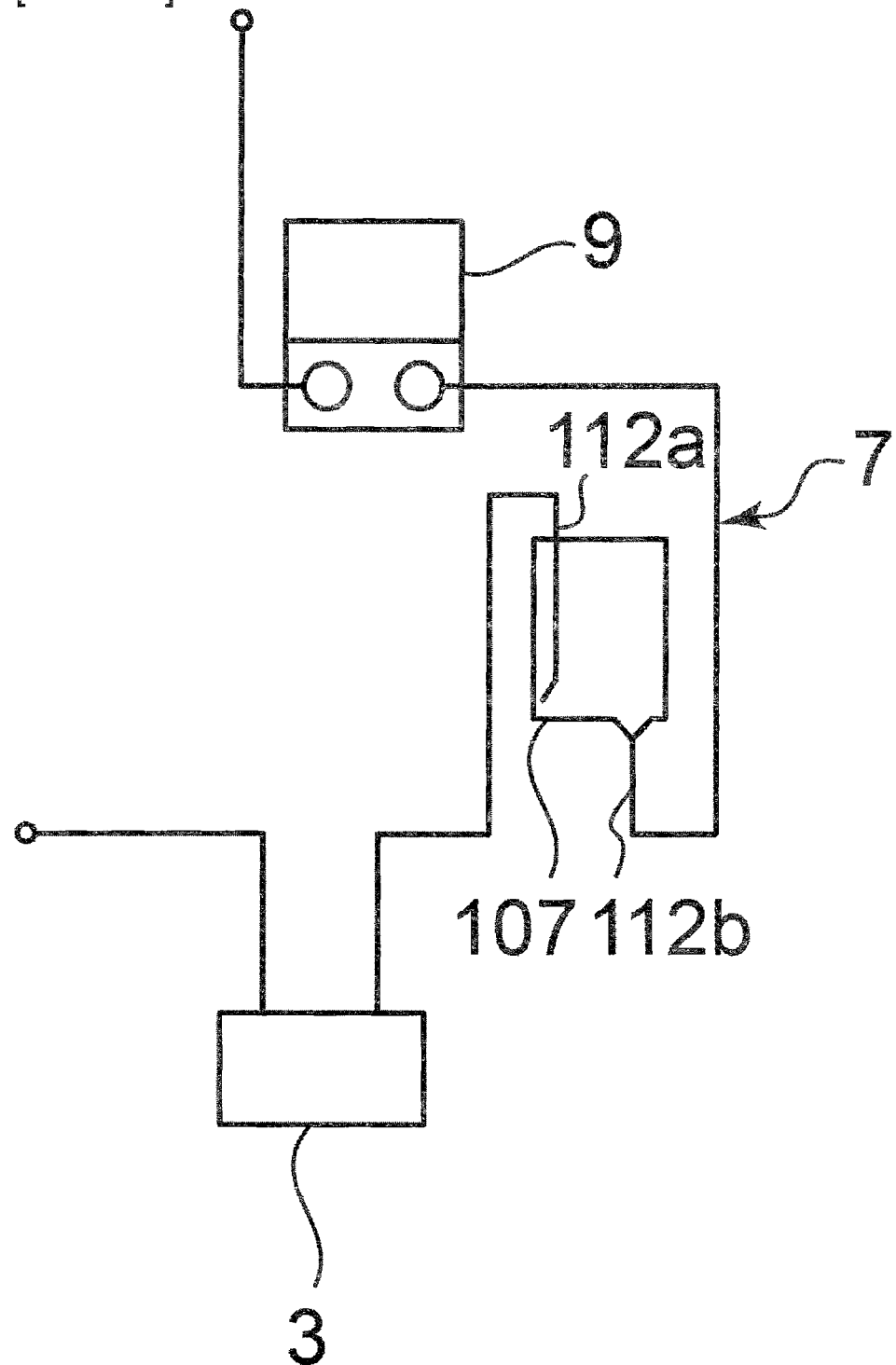
[FIG. 12]

[FIG. 13]
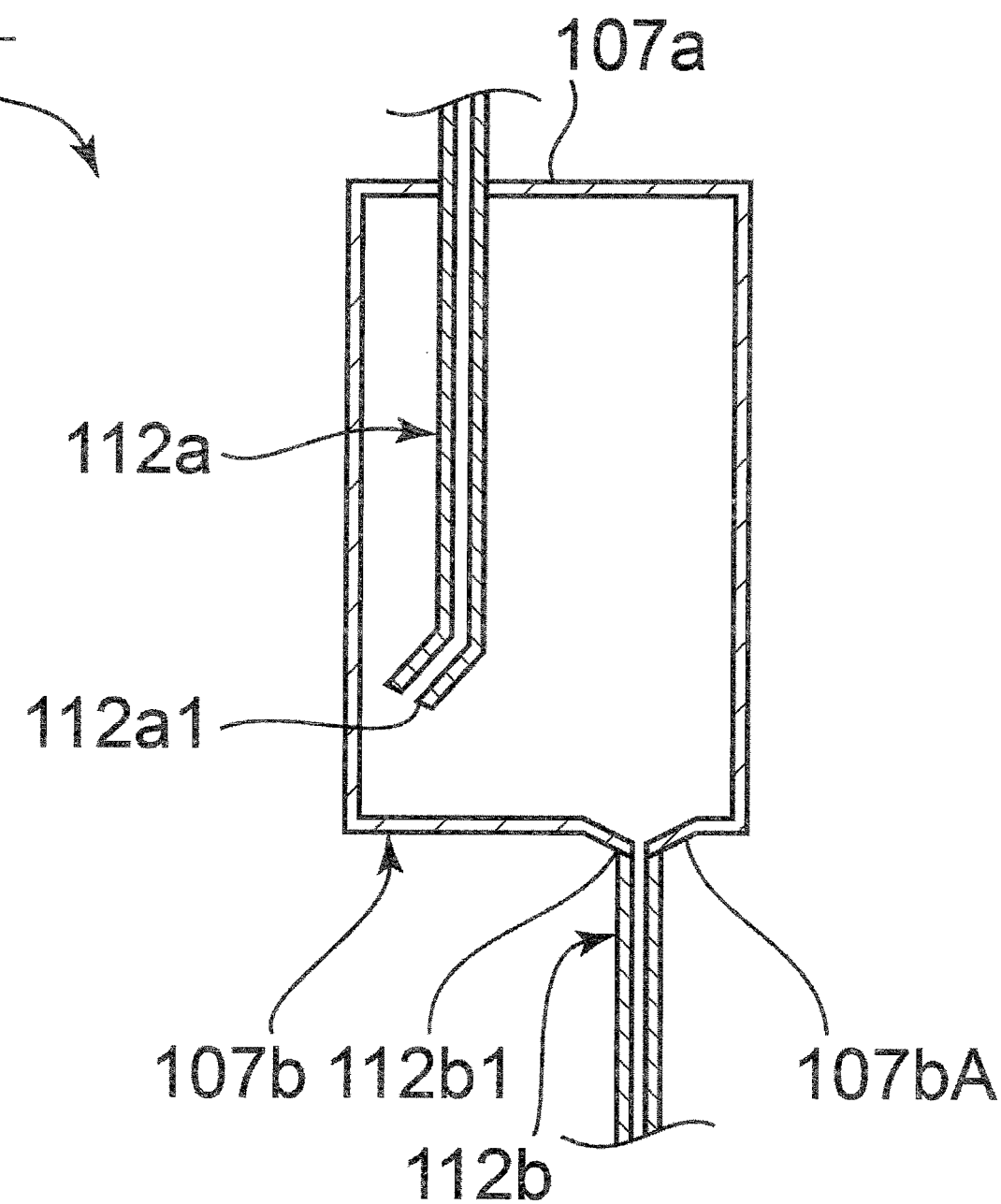

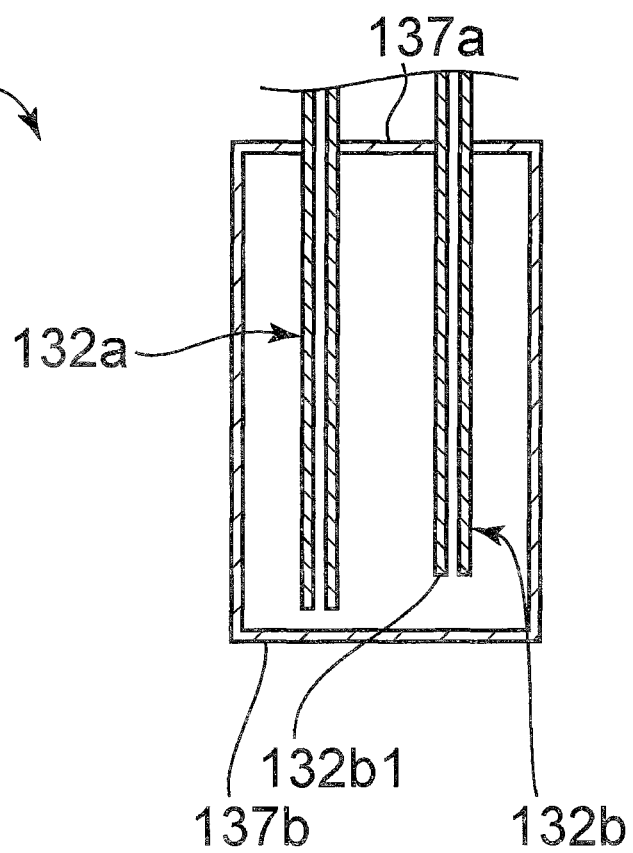
[FIG. 14]

[FIG. 15]
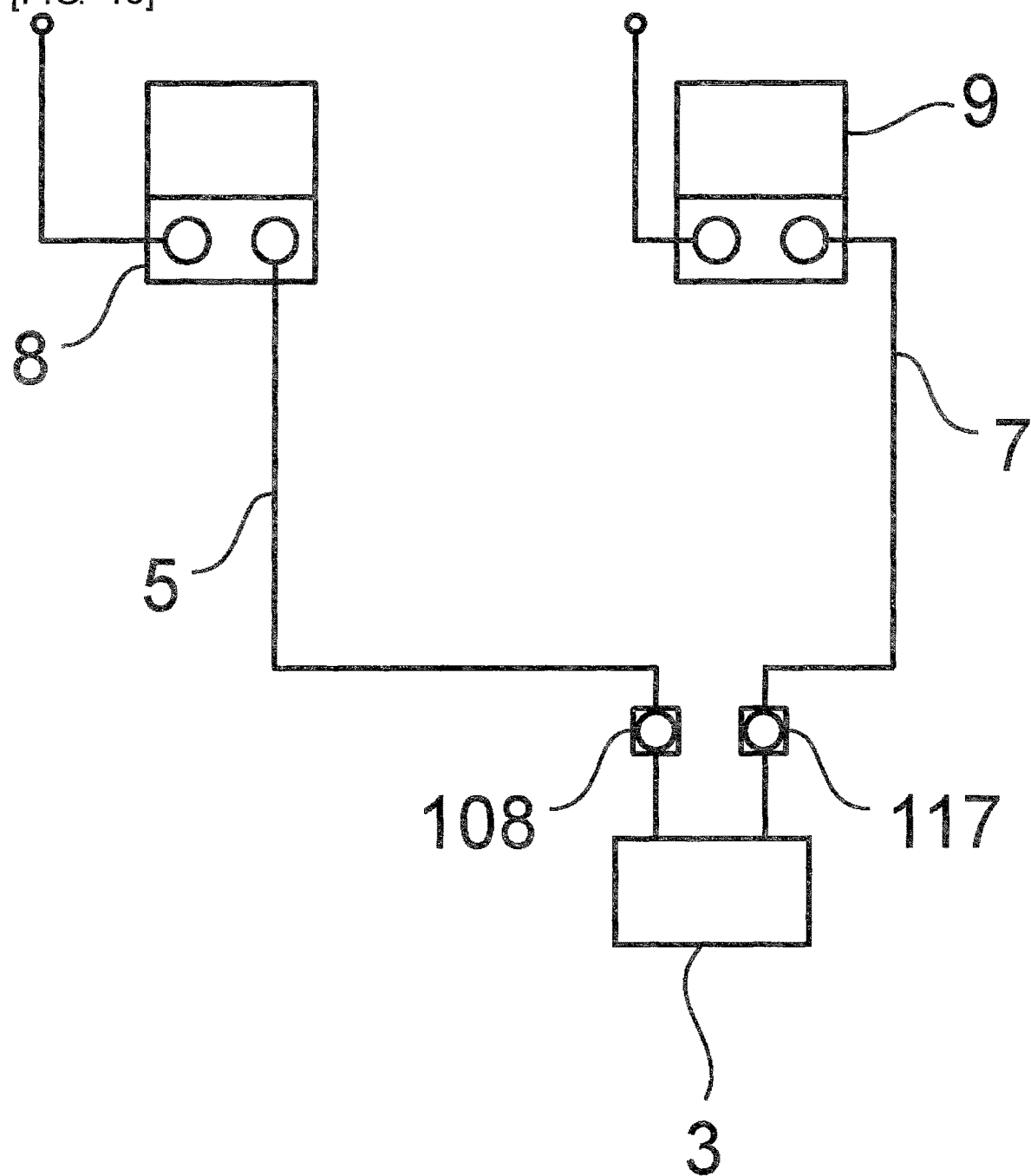

[FIG. 16]
(a)
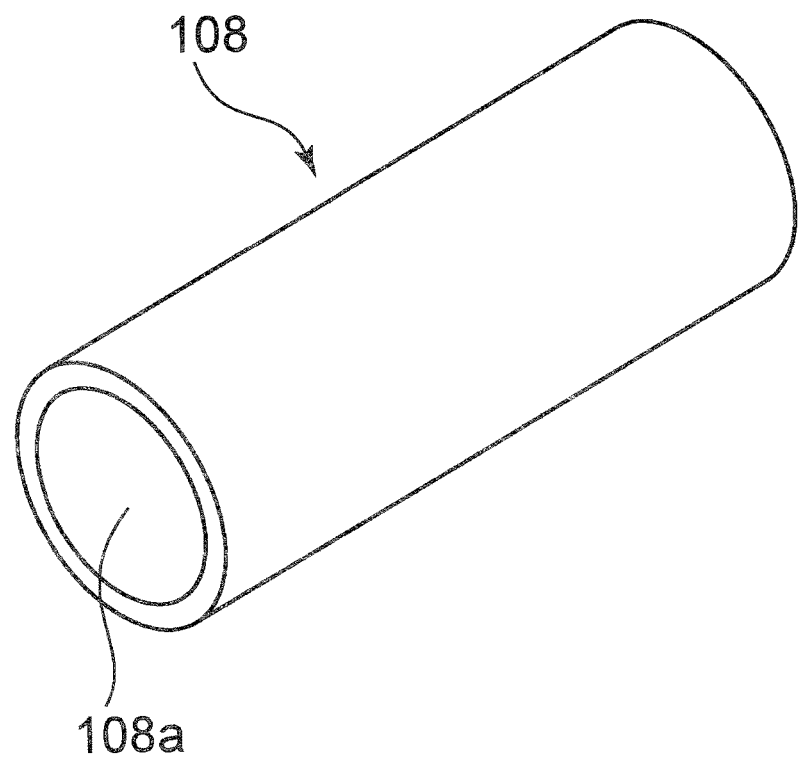
(b)
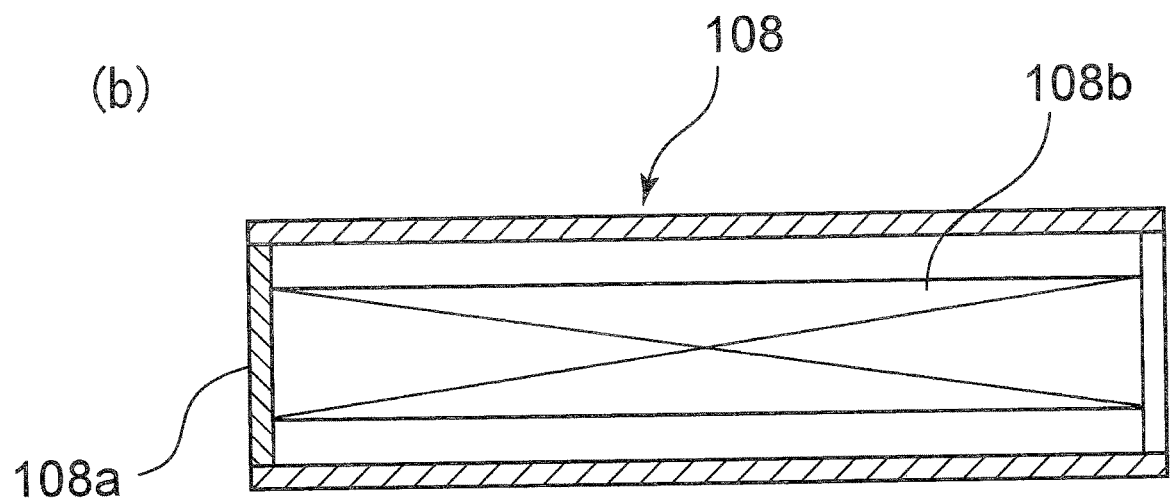

[FIG. 17]
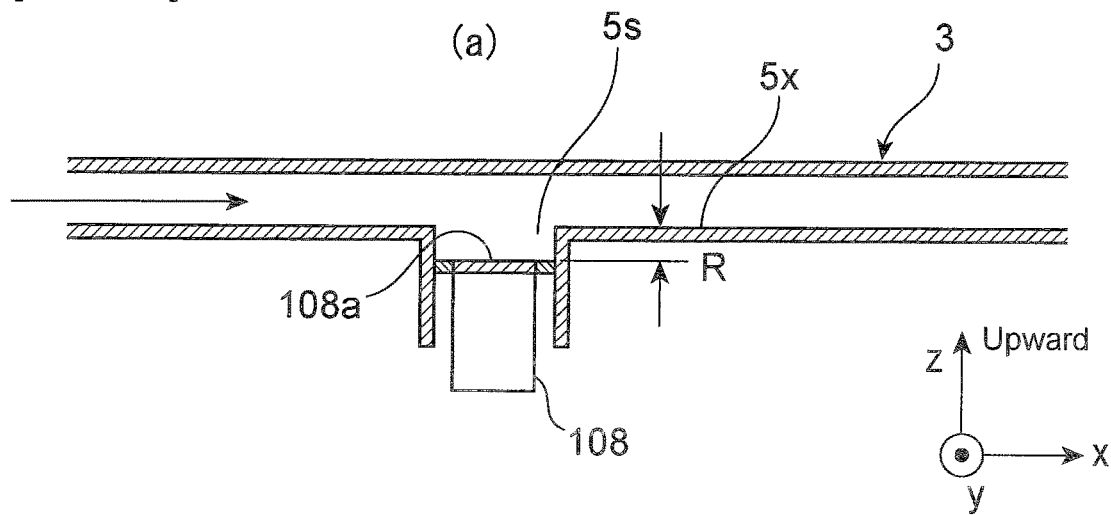
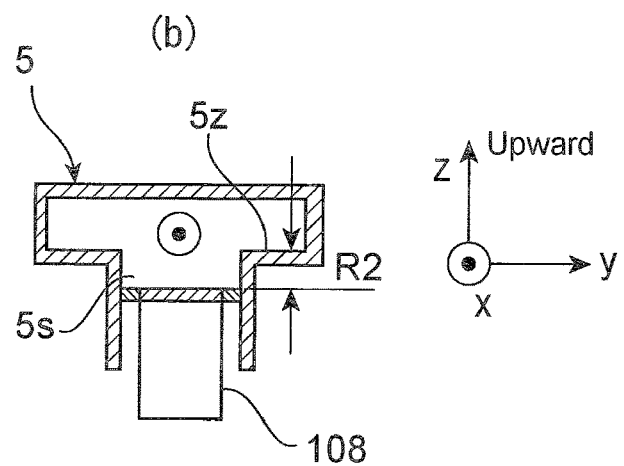
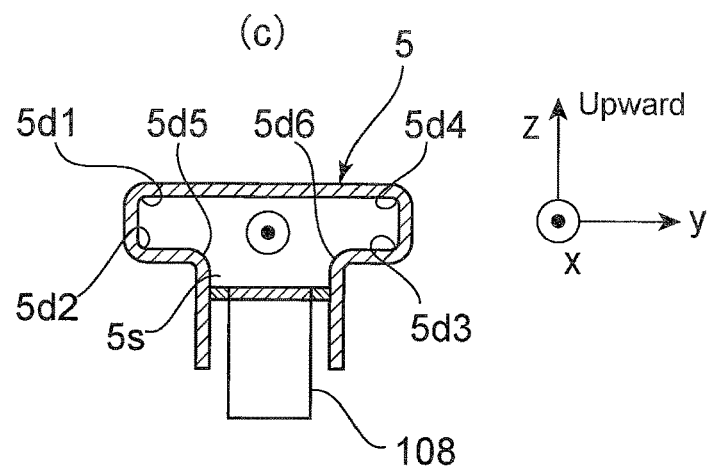

[FIG. 18]
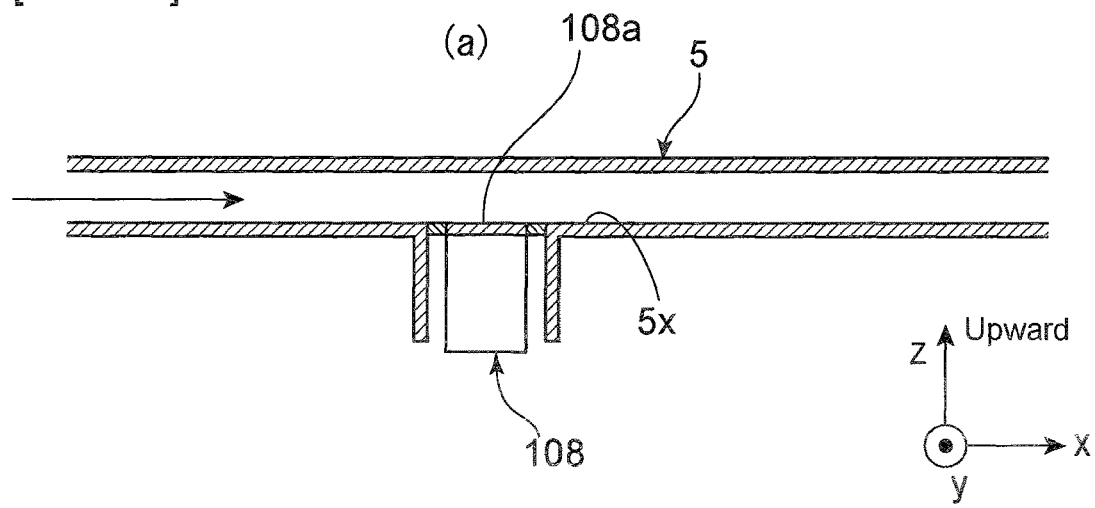
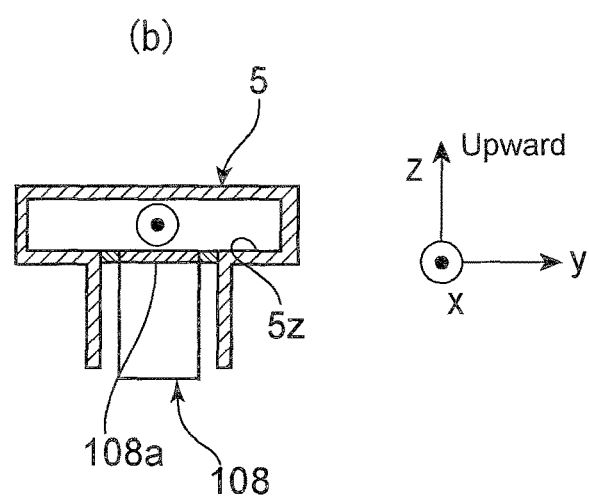
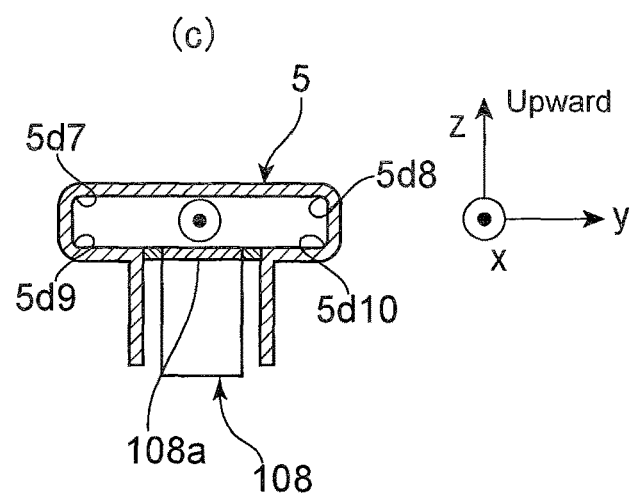

[FIG. 19]
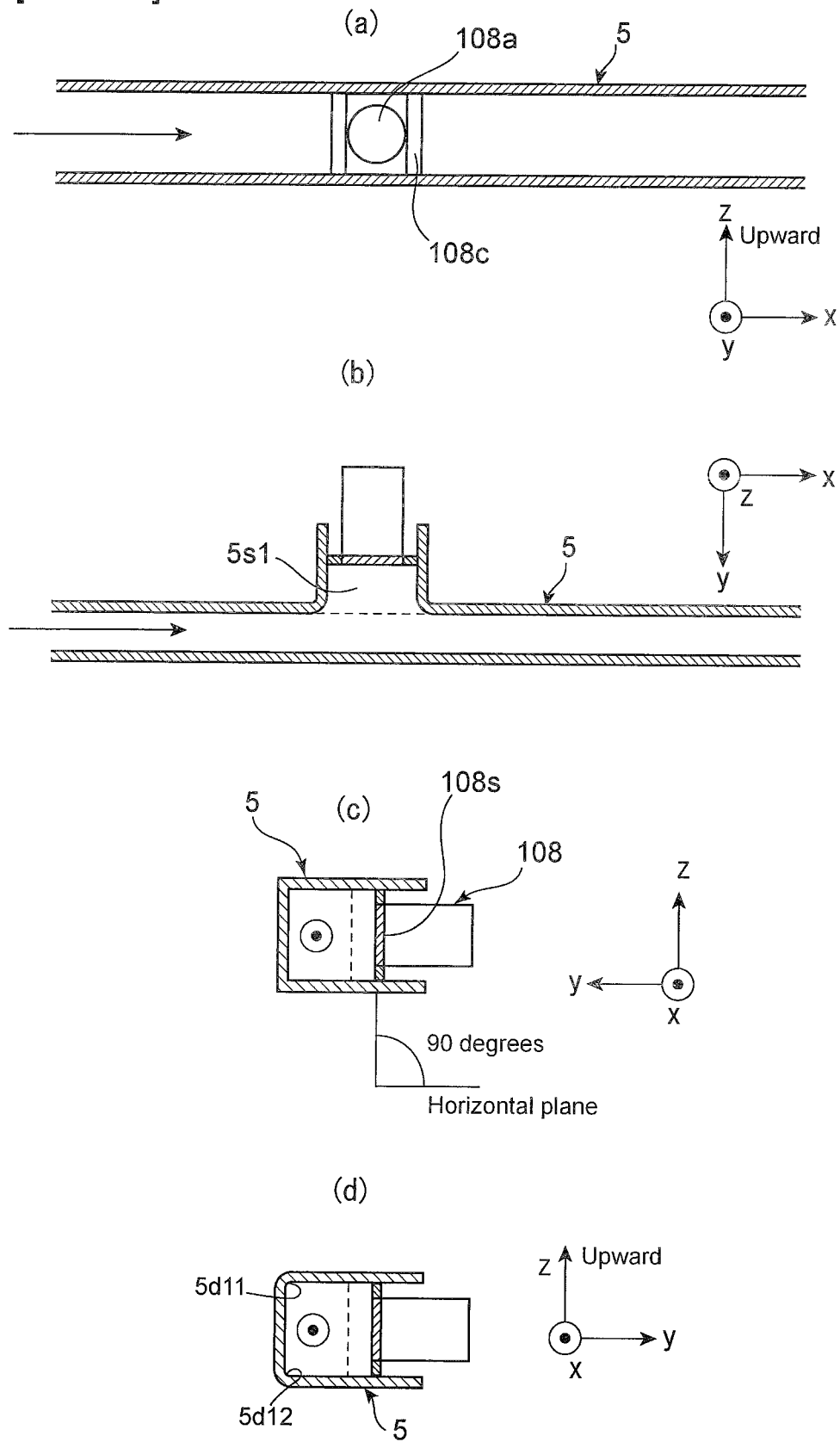

[FIG. 20]
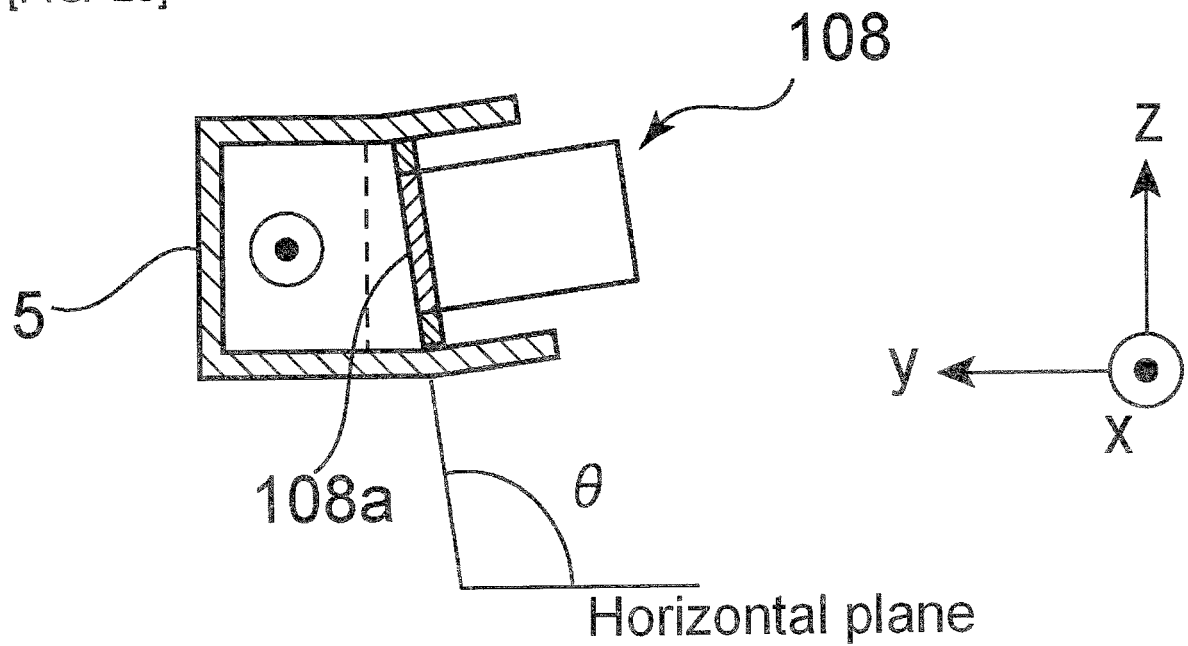
[FIG. 21]
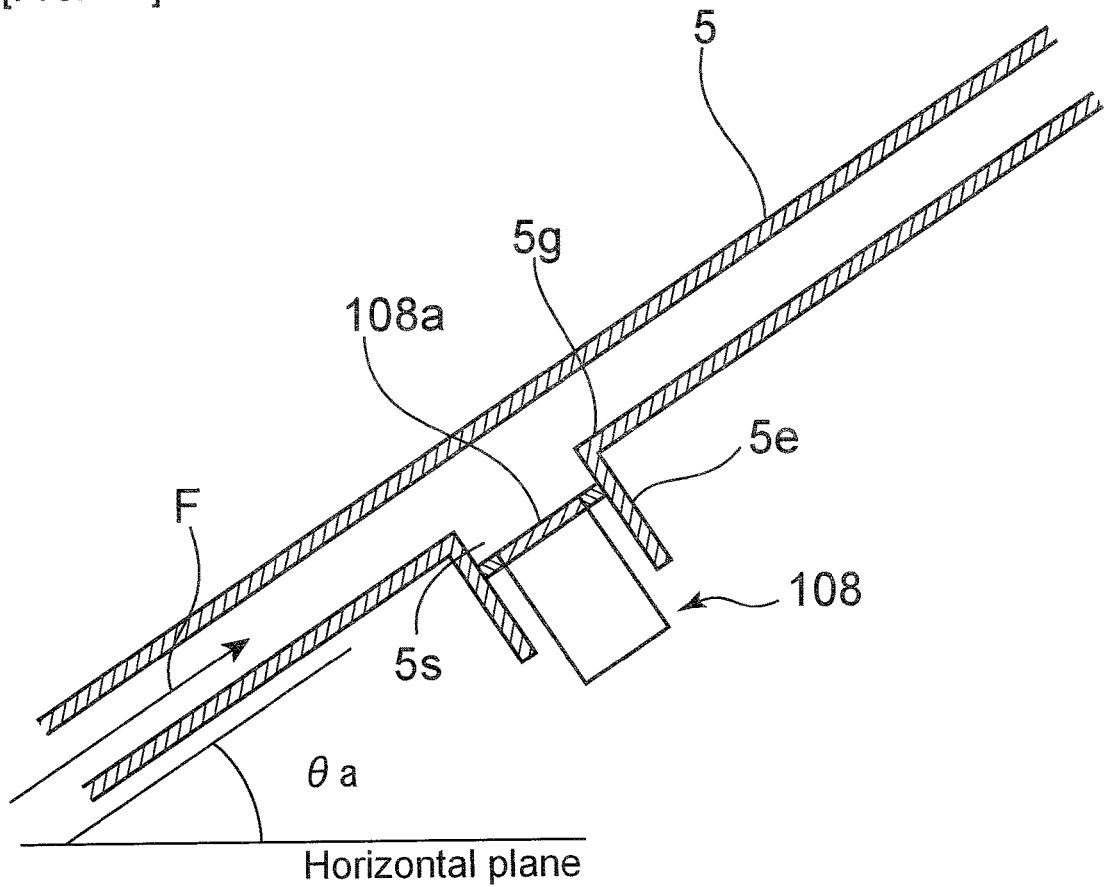

[FIG. 22]
(a)
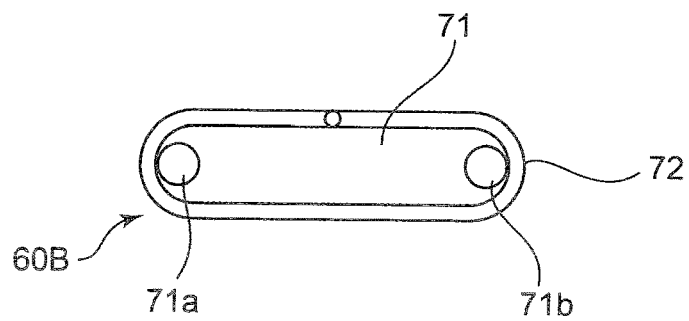
(b) (c)
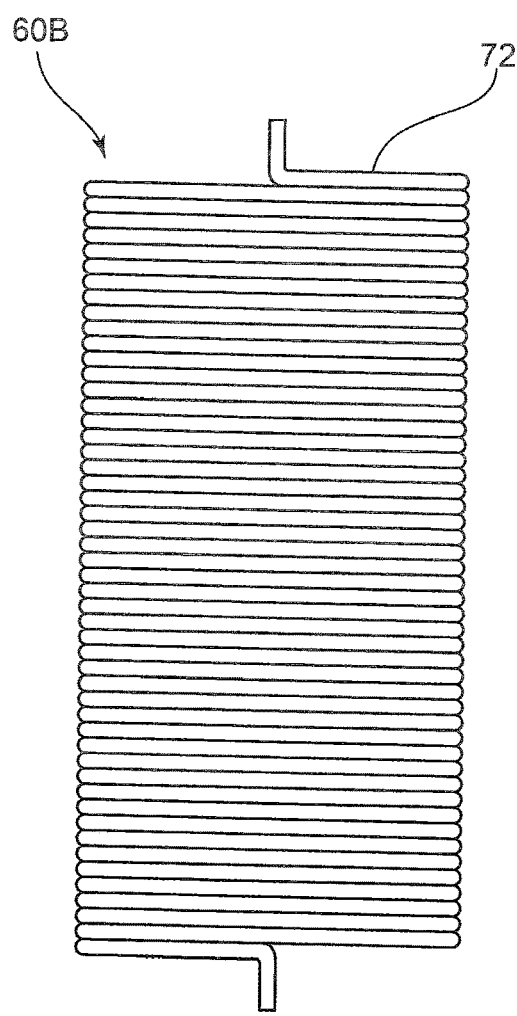
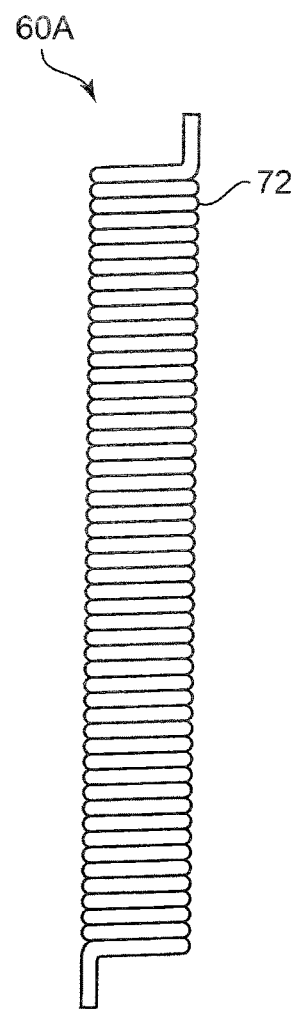

LIQUID EJECTION DEVICE

TECHNICAL FIELD

The present invention relates to a liquid ejection device for applying a liquid composition to a member to be coated, and especially to a liquid ejection device to be used suitably in producing a semiconductor device, for example, in applying a curable composition for bonding an electronic component such as a semiconductor chip to another electronic component, a wiring substrate, or the like, or in applying a curable composition for forming a resist film on a substrate or a wiring substrate.

BACKGROUND ART

Conventionally, a screen printing system has been used as a method of applying this type of curable composition to a member to be coated. However, the screen printing system has many steps and takes a prolonged tact time and therefore is problematic in production efficiency. Accordingly, methods of applying a curable composition to a member to be coated by using a liquid ejection device have been proposed in recent years.

When applying a curable composition with a liquid ejection device, it is difficult to eject the curable composition from a head because the curable composition is relatively high in viscosity at normal temperature, and therefore, it is necessary to reduce the viscosity of the curable composition to some extent at the time of application and thereby allow the liquid composition to have flowability. There has been proposed a liquid ejection device configured to be able to stably eject a curable composition from a head by heating the curable composition within the device to raise its temperature and thereby reducing the viscosity to increase flowability (see, for example, Patent Document 1). In Patent Document 1, a heating means (heater) for heating an ink is provided between a head and a tank for supplying an ink (curable composition) to the head, and the ink heated to a high temperature by the heating means is fed to the head and then ejected.

PRIOR ART DOCUMENT

Patent Document

Patent Document 1: Japanese Patent No. 5404498

SUMMARY OF THE INVENTION

Problems to be Solved by the Invention

However, if only one heating means for heating an ink (curable composition) is provided as in Patent Document 1, it is necessary to heat an ink (curable composition) by setting the heating temperature of the heating means greatly higher than the above-mentioned temperature at which ejection can be performed in order to heat the ink (curable composition) in a short time to a temperature at which ejection can be performed. In this case, however, the curable composition is heated excessively, and as a result, there is a problem that properties of the curable composition to be ejected from the head are changed and the curable composition is degraded. On the other hand, if the heating temperature of a heating means is set near a temperature at which an ink (curable composition) can be ejected, there is a problem that time is required to heat the ink (curable composition) to the above-mentioned temperature at which the ejection can be performed. Especially, when the above-mentioned temperature at which the ejection can be performed is higher than room temperature, for example, 60° C. or higher, there occurs a problem that the temperature cannot be raised to a temperature at which ejection can be performed due to large heat radiation even if time is spent.

The present invention was devised in order to solve the problems described above, and an object of the present invention is to provide a liquid ejection device capable of applying a high quality curable composition stably and efficiently by heating the curable composition to a temperature at which the curable composition can be ejected from a head, in a short time without heating the curable composition excessively.

Means for Solving the Problems

According to the present invention, there is provided a liquid ejection device comprising: a first tank for retaining a liquid composition; a head for ejecting the liquid composition; a first heating means for heating the liquid composition retained within the first tank; a first channel for supplying the liquid composition from the first tank to the head; a second heating means for heating the liquid composition passing through the first channel at a heating temperature higher than that of the first heating means; a second channel for returning the liquid from the head to the first tank; and a pump connected to the first channel or the second channel and pumping the liquid composition; wherein the temperature difference between the heating temperature of the second heating means and the heating temperature of the first heating means is 65° C. or less.

Furthermore, according to the present invention, there is provided a liquid ejection device comprising: a first tank for retaining a liquid composition; a head for ejecting the liquid composition; a first heating means for heating the liquid composition retained within the first tank; a first channel for supplying the liquid composition from the first tank to the head; a second heating means for heating the liquid composition passing through the first channel at a heating temperature higher than that of the first heating means; a second channel for returning the liquid composition from the head to the first tank; and a pump connected to the first channel or the second channel and pumping the liquid composition; wherein the temperature difference between the lowest temperature of a temperature range providing a viscosity range of the liquid composition in which the liquid composition is capable of being ejected and the heating temperature of the second heating means is 30° C. or less.

In the present invention, it is preferred in the liquid ejection device having the above-mentioned configuration that the heating temperature of the second heating means is not lower than 45° C. and not higher than 110° C. and the heating temperature of the first heating means is 40° C. or higher.

The liquid composition is preferably a curable composition that is cured by the application of heat or a curable composition that is cured by the application of heat or the irradiation with light.

It is preferred that a switching valve selectively switchable between supply of the liquid composition passing through the first channel to the head and supply of the liquid composition passing through the first channel to the second channel is provided downstream of the second heating means of the first channel.

It is preferred that the pump is connected to both the first channel and the second channel.

It is preferred that a second tank to supply the liquid composition to the first tank is further provided. In this case, it is preferred that the temperature difference between the heating temperature of the second heating means and the heating temperature of the first heating means is not less than 5° C. and not more than 65° C.; for example, it is preferred that the heating temperature of the second heating means is not lower than 45° C. and not higher than 110° C. and the heating temperature of the first heating means is not lower than 40° C. and not higher than 90° C.

In the present invention, it is preferred that the surface area per unit volume of the channel heated by the second heating means is 1.15 mm$^2$/mm$^3$ or more.

In the present invention, it is preferred that there is further provided a buffer tank being connected to the channels and having an upper surface and a lower surface, and it is also preferred that the channels have first and second tubing segments connected to the buffer tank, the second tube is connected to the lower surface of the buffer tank, the first tubing segment is extended into the buffer tank, and an end of the first tube is located above the end of the second tubing segment connected to the buffer tank.

In the present invention, it is preferred that the lower surface of the buffer tank has a projecting part that projects downward and the second tubing segment is connected to the projecting part.

In the present invention, it is preferred that there is further provided a pressure sensor for detecting the pressure of the liquid composition in the channel, the pressure sensor being connected to the channel, wherein the pressure sensor has a pressure sensing face and the pressure sensing face is located within a range up to 1 mm from the same plane as the inner channel surface of the channel part, to which the pressure sensor is attached, to the outside from the inner channel surface.

It is preferred that the temperature difference between the lowest temperature of the temperature range where the liquid composition can be ejected from the head and the heating temperature of the second heating means is 30° C. or less. It is preferred that the viscosity of the liquid composition at the time of being ejected from the head is not lower than 3 mPa·s and not higher than 1500 mPa·s. It is preferred that the liquid composition contains a photocurable compound, a photo or thermo curable compound, a thermocurable compound, a photopolymerization initiator, and a thermal curing agent.

Effect of the Invention

By use of a liquid ejection device of the present invention, it is possible to bring a liquid composition to an increased temperature at which the liquid composition comes to have a viscosity as low as the liquid composition can be ejected from the head, in a short time without heating the liquid composition excessively rapidly, and therefore it is possible to apply a high-quality composition stably and efficiently.

BRIEF DESCRIPTION OF THE DRAWINGS

FIG. 1 is a schematic diagram illustrating a schematic configuration of a liquid ejection device according to a first embodiment of the present invention.

FIG. 2 is a plan view of a heating device.

FIG. 3 is a cross-sectional view taken along line A-A of FIG. 2.

FIG. 4 is a schematic diagram illustrating a schematic configuration of a liquid ejection device according to another embodiment of the present invention.

FIG. 5 is a schematic diagram illustrating a schematic configuration of a liquid ejection device according to another embodiment of the present invention.

FIG. 6 is a schematic diagram illustrating a schematic configuration of a liquid ejection device of a comparative example.

FIG. 7 is a plan view of a liquid heating device to be used in the liquid ejection device of the second embodiment of the present invention.

FIG. 8 is a front view of a liquid heating device to be used in the liquid ejection device of the second embodiment of the present invention.

FIG. 9 is a cross-sectional view taken along line A-A in FIG. 7.

FIG. 10 is a cross-sectional view taken along line B-B in FIG. 7.

FIG. 11 is a cross-sectional close up view illustrating a channel in the second embodiment.

FIG. 12 is a schematic diagram illustrating a major part of the liquid ejection device according to the third embodiment.

FIG. 13 is a partially broken-away front cross-sectional view illustrating a buffer tank and its environs in the third embodiment.

FIG. 14 is a partially broken-away front cross-sectional view for explaining a buffer tank of a reference example.

FIG. 15 is a schematic diagram for explaining a major part of the liquid ejection device according to the fourth embodiment of the present invention.

FIGS. 16(a) and 16(b) are a perspective view illustrating the appearance of a pressure sensor and a schematic cross-sectional view of the pressure sensor.

FIGS. 17(a) and 17(b) are a schematic partially broken-away front view of a part at which a pressure sensor is provided and a schematic cross-sectional view of the part viewed in the transverse cross-sectional direction of the channel, and FIG. 17(c) is a schematic cross-sectional view of a sensor attachment portion viewed in the transverse cross-sectional direction of the channel in a modified example.

FIGS. 18(a) and 18(b) are a schematic front view for explaining still another example of the geometric relationship of a channel and a pressure sensor and a diagram illustrating the geometric relationship viewed in the transverse cross-sectional direction of the channel, and FIG. 18(c) is a cross-sectional view of a channel attachment portion, taken along the transverse cross-sectional direction of the channel in a preferred modified example.

FIGS. 19(a) and 19(b) are a front view for explaining still another modified example of the geometric relationship of a pressure sensor and a channel, and a diagram illustrating the geometric relationship of the channel and the pressure sensor viewed in the transverse cross-sectional direction of the channel, FIG. 19(c) is a diagram viewed in the transverse cross-sectional direction of a channel for explaining still another modified example of the geometric relationship of a pressure sensor and the channel, and FIG. 19(d) is a schematic cross-sectional view for explaining its further preferable modified example.

FIG. 20 is a cross-sectional view for explaining the angle between the pressure sensing face and the horizontal plane.

FIG. 21 is a schematic partially broken-away cross-sectional view for explaining still another modified example of the geometric relationship of a pressure sensor and a channel.

FIGS. 22(a) to 22(c) are a front view, a plan view, and a right side view, respectively, for explaining a modified example of a liquid heating device as a heating member to be used in a liquid ejection device of the present invention.

MODE FOR CARRYING OUT THE INVENTION

Embodiments of the present invention will now be described below with reference to the accompanying drawings. FIG. 1 schematically illustrates a schematic configuration of a liquid ejection device 1 according to the first embodiment of the present invention. The liquid ejection device 1 of FIG. 1 is a device for applying a liquid composition by an inkjet system to a member to be coated, and this includes a first tank 2 for retaining a composition, at least one head 3 for ejecting the liquid composition, a first heating means for heating the liquid composition retained within the first tank 2; a first channel 5 for supplying the liquid composition from the first tank 2 to the head 3, a second heating means 6 for heating the liquid composition passing through the first channel 5, and a second channel 7 for returning the liquid composition from the head 3 to the first tank 2. In addition, a first pump 9 and a second pump 8 are connected to the second channel 7 and the first channel 5, respectively.

Examples of the member to be coated include electronic components such as semiconductor chips, and substrates. Examples of the substrates include printed substrates and glass substrates, and the substrates include a wiring substrate provided with wiring or the like on its top surface. In this case, the liquid composition to be used is a curable composition that cures through the action of heat or light, for example, after its application to the member to be coated to form a cured material layer on the member to be coated. The liquid ejection device 1 of the present invention is suitably used to apply a curable composition to a member to be coated in producing a semiconductor device, for example, in applying a curable composition for forming an adhesive layer (a cured material layer) for bonding, to an electronic component such as a semiconductor chip, another electronic component, a wiring substrate or the like, or in applying a curable composition for forming a resist layer (a cured material layer) such as a solder resist pattern on a wiring substrate. As the liquid composition, a composition that does not cure through the action of heat or light may be used depending on the intended application (an object to be coated).

The curable composition has a property to decrease in viscosity by raising the temperature thereof to a certain temperature with heating. Owing to this, the curable composition has flowability, and therefore it can be ejected stably from the head 3. On the other hand, the curable composition preferably has a property to increase in viscosity if it is cooled to a temperature equal to or lower than room temperature. Moreover, the curable composition is preferably curable by heating, and it is preferably curable either by heating or by irradiation with light, and it may be curable by irradiation with light. The curable composition curable by heating is particularly preferable because it allows a process after its application to a member to be coated, or it can be cured optionally by heat even after being bonded to another component or after passing through another step. However, the curable composition curable by heating cures with heating, in other words, increases in viscosity. For this reason, in the case of ejecting with a liquid ejection device the curable composition curable by heating, there is a problem that the curable composition cures and cannot be ejected from the head if it is heated excessively, and also in the case of insufficient heating, the curable composition cannot be ejected from the head 3 due to its low flowability. Thus, in conventional liquid ejection devices, it is difficult to suitably eject a curable composition curable by heating from the head 3, and therefore curable compositions curable by heating have not been used frequently. As a result of earnest investigations for solving the above-described problems, the liquid ejection device according to the present invention is configured to be capable of suitably ejecting a curable composition curable by heating from the head 3.

As described above, the curable composition preferably contains a curable compound, and a photopolymerization initiator and/or a thermal curing agent. More preferably, the curable composition contains a photocurable compound (a compound curable by irradiation with light), a photo or thermo curable compound (a compound curable by irradiation with light and heating), a thermocurable compound (a compound curable by heating), a photopolymerization initiator, and a thermal curing agent. Moreover, it is preferred that the curable composition contains a curing accelerator. Hereafter, components that can be used for the curable composition will be explained.

(Curable Compound)

It is preferred that the curable compound includes a photocurable compound, a photo or thermo curable compound, and a thermocurable compound.

The photocurable compound is a compound having a photocurable functional group, and examples thereof include radically polymerizable monomers having a vinyl group, such as (meth)acrylic compounds. The photo or thermo curable compound is a compound having a photocurable functional group and a thermocurable functional group, and examples thereof include compounds having a (meth)acryloyl group and a cyclic ether group. The thermocurable compound is a compound having a thermocurable functional group, and examples thereof include epoxy compounds and oxetane compounds. As used herein, the term "(meth)acryloyl group" means both an acryloyl group and a methacryloyl group.

(Photopolymerization Initiator)

The photopolymerization initiator includes a photoradical polymerization initiator, a photocationic polymerization initiator, and the like, and preferably, it is a photoradical polymerization initiator. As to the photopolymerization initiator, any one thereof may be used alone or any combination of two or more thereof may be used. The photoradical polymerization initiator is not particularly limited. The photoradical polymerization initiator is a compound that generates radicals upon irradiation with light to initiate a radical polymerization reaction. Specific examples of the photoradical polymerization initiator include benzoin, benzoin alkyl ethers, acetophenones, aminoacetophenones, anthraquinones, thioxanthones, ketals, 2,4,5-triarylimidazole dimer, riboflavin tetrabutyrate, thiol compounds, 2,4,6-tris-s-triazine, organic halogen compounds, benzophenones, xanthones, and 2,4,6-trimethylbenzoyldiphenylphosphine oxide. As to the photoradical polymerization initiator, any one thereof may be used alone or any combination of two or more thereof may be used.

Together with the photoradical polymerization initiator, a photopolymerization initiation aid may also be used. Examples of the photopolymerization initiation aid include ethyl N,N-dimethylaminobenzoate, isoamyl N,N-dimethylaminobenzoate, pentyl-4-dimethylaminobenzoate, triethylamine, and triethanolamine. Other photopolymerization initiation aids may also be used. As to the photopolymerization initiation aid, any one thereof may be used alone or any combination of two or more thereof may be used.

In addition, a titanocene compound having absorption in the visible light region, such as CGI-784 (produced by Ciba Specialty Chemicals), or the like may also be used to promote a photoreaction.

The photocationic polymerization initiator is not particularly limited, and examples thereof include sulfonium salts, iodonium salts, metallocene compounds, and benzoin tosylate. As to the photocationic polymerization initiator, any one thereof may be used alone or any combination of two or more thereof may be used.

(Thermal Curing Agent)

Examples of the thermal curing agent include organic acids, amine compounds, amide compounds, hydrazide compounds, imidazole compounds, imidazoline compounds, phenol compounds, urea compounds, polysulfide compounds, and acid anhydrides. It is also possible to use a modified polyamine compound, such as an amine-epoxy adduct, as the thermal curing agent. Other thermal curing agents may also be used.

(Curing Accelerator)

Examples of the curing accelerator include tertiary amines, imidazole, quaternary ammonium salts, quaternary phosphonium salts, organic metal salts, phosphorus compounds, and urea compounds.

The head 3 has a plurality of nozzles N for ejecting a curable composition to a member to be coated. In this embodiment, a light irradiation device 31 is integrally connected to the head 3. When the curable composition is cured by irradiation with light, the curable composition applied to a member to be coated can be cured by applying light to the curable composition from a light source 32 of the light irradiation device 31 at the same time when or after ejecting the curable composition from the nozzles. The light source 32 is not particularly limited, and there can be used various illuminating devices such as an LED lamp, a low-pressure mercury lamp, a medium-pressure mercury lamp, a high-pressure mercury lamp, an ultrahigh-pressure mercury lamp, a xenon lamp, a black light lamp, and a metal halide lamp. The head 3 is arranged such that the nozzles thereof may oppose the surface of a member to be coated and are movable along a plane direction (the X direction and/or the Y direction) with respect to the surface of the member to be coated. The head 3 may be provided with a temperature sensor (not shown) for detecting the temperature of the curable composition to be ejected from the nozzles. The light irradiation device 31 does not necessarily need to be connected to the head 3.

The head 3 is connected to the first tank 2 via the first channel 5. To the first channel 5 is connected a second pump 8, and the curable composition in the first tank 2 is pumped by the second pump 8 and is supplied to the head 3 through the first channel 5. The first channel 5 is formed of a pipe made of, for example, resin or metal, a tube made of resin, or the like.

The first tank 2 is an item with a configuration in which the top opening of a bottomed cylindrical body is covered with a lid, and it retains therein a curable composition and supplies the curable composition retained therein to the head 3 through the first channel 5 connected to the body. Examples of the material of the first tank include metal and glass which are high in heat resistance, such as stainless steel.

The first tank 2 is provided with an electric heater 40 as a first heating means 4 for heating the curable composition retained in the tank. The heater 40 heats the curable composition in the first tank 2 before supplying it to the head 3, thereby raising the temperature of the curable composition to a prescribed first temperature t. The heater 40 is provided on the outer wall surface of the first tank 2, and the curable composition heated by the first heating means 4 is supplied to the first channel 5 from the first tank 2.

The first tank 2 may be provided with, for example, a temperature sensor (not shown) for detecting the temperature of the curable composition retained therein, a sensor (not shown) for detecting the remaining amount of the curable composition on the basis of the position of the surface of the curable composition retained therein, and a stirring device (not shown) for stirring the curable composition retained therein to unify the overall temperature of the liquid composition.

In this embodiment, a heating device 60 is provided as the second heating means 6 at the midway of the first channel 5. The heating device 60 has a thermal conductor 61 comprising a pair of opposed thermally conductive plates 61A, 61B, and an electric heater 62 attached to one or both of the thermally conductive plates 61A, 61B as depicted in FIG. 2 and FIG. 3.

Both of the thermally conductive plates 61A, 61B are in a plate-like form having a prescribed thickness and being rectangular in plan, and these are formed in the same size and are fixed to each other with a fixing means 67 such as a bolt. The thermally conductive plates 61A, 61B are formed of a material with high thermal conductivity: for example, they are formed of aluminum or an aluminum alloy. One thermally conductive plate 61A has a recessed groove 64 formed on a face thereof that faces the other thermally conductive plate 61B, and one or the other of the thermally conductive plates 61A, 61B is provided with an inlet port 65 and an outlet port 66 interconnected to one end and the other end of the groove 64, respectively. To each of the inlet port 65 and the outlet port 66 is fixed the first channel 5, and the curable composition supplied to the first channel 5 from the first tank 2 is once introduced to the groove 64 of the thermal conductor 61 through the inlet port 65, passes through the groove 64, then is returned to the first channel 5 through the outlet port 66, and is supplied to the head 3. When the curable composition passes through the groove 64, the heat of the heater 62 is transmitted to the curable composition in the groove 64 via the thermal conductor 61, and thus the curable composition is heated. Accordingly, the curable composition supplied from the first tank 2 further increases in temperature and the temperature is raised to a desired second temperature T. The groove 64 is formed to wind almost throughout the one thermally conductive plate 61A. This affords an enlarged contact area where the curable composition passing through the groove 64 comes into contact with the thermally conductive plates 61A, 61B, so that the curable composition is heated by the thermal conductor 61 sufficiently and uniformly. Although the shape in cross-sectional view of the groove 64 is a rectangular shape in this embodiment, the shape in cross-sectional view is not particularly limited and may be various shapes, such as a semi-circular shape, as long as it is recessed in a concave manner. The pair of thermally conductive plates 61A, 61B allow a sealing member 68, such as a packing, to intervene therebetween to surround the circumference of the groove 64. The groove 64 is fluidly sealed with this sealing member 68. The thermal conductor 61 may be provided with a temperature sensor (not shown) for detecting the temperature of the curable composition passing through the groove 64.

In another embodiment of the heating device 60, a heater which is a heat source may be provided in at least one of the thermally conductive plates 61A and 61B.

The curable composition has a temperature characteristic that its viscosity varies depending upon temperature conditions, for example, the viscosity is high at low temperatures and low at high temperatures. If the viscosity of the curable composition at the time of being ejected from the head 3 is high, the curable composition is difficult to be ejected due to its low flowability and therefore the curable composition cannot be applied to a member to be coated. Thus, the temperature of the curable composition at its ejection is required to be adjusted to a high temperature so that the curable composition may have a viscosity at which the curable composition has flowability at which it can be ejected from the head 3 easily. On the other hand, a curable composition that is thermocurable remarkably increases in viscosity and decreases in flowability if the temperature thereof at the time of ejection is excessively high. Thus, the temperature of the curable composition at its ejection, which depends on the liquid composition of the curable composition, is preferably 40° C. or higher, more preferably 60° C. or higher, and even more preferably 100° C. or lower from the viewpoint of increasing the flowability of the curable composition. Especially, when a thick film of a cured material layer is formed from a curable composition on a member to be coated, that temperature is preferably 60° C. or higher, more preferably 100° C. or lower. This is because if the temperature of a curable composition at its ejection is 60° C. or higher, a curable composition the viscosity of which is high at room temperature can be used and a desired thick film can be formed at a small amount of ejection. Moreover, the viscosity of a curable composition at its ejection is preferably 3 mPa·s or more, more preferably 5 mPa·s or more, more preferably 1500 mPa·s or less, even more preferably 1200 mPa·s or less, even more preferably 100 mPa·s or less, and even more preferably 40 mPa·s or less. The viscosity is measured in accordance with JIS K2283 using an E-type viscometer ("TVE22L" manufactured by Toki Sangyo Co. Ltd.) at the temperature during ejection.

Here, the curable composition after being heated by the second heating means 6 (heating device 60) is cooled during its passing through the first channel 5, and the temperature drops by about 5° C. to 30° C. during its supply to the head 3. Therefore, considering this drop of temperature, the heating temperature (second temperature T) of the second heating means 6 (heating device 60) is preferably not lower than 45° C. and not higher than 110° C., more preferably not lower than 60° C. and not higher than 105° C., even more preferably not lower than 65° C. and not higher than 105° C., even more preferably not lower than 65° C. and not higher than 100° C., even more preferably not lower than 70° C. and not higher than 95° C., and even more preferably not lower than 80° C. and not higher than 95° C. Considering the heat radiation described above, it is more preferred that the temperature difference between the lowest temperature of the temperature range where the curable composition can be ejected from the head 3 and the heating temperature of the second heating means 6 is 30° C. or less.

On the other hand, although the first heating means 4 (heater 40) heats a curable composition beforehand at a lower temperature than the heating temperature of the second heating means 6 (heating device 60), the heating temperature of the first heating means is preferably brought into a range to afford a temperature difference of 65° C. or less, more preferably 55° C. or less, even more preferably 50° C. or less, compared with the heating temperature of the second heating means 6 (heating device 60). It is still more preferred to bring that heating temperature into a range to afford a temperature difference of 5° C. or more. This is because heating by the second heating means 6 (heating device 60) is excessive heating and thus the curable composition to be ejected from the head 3 is degraded if that temperature difference exceeds 65° C. If the heating temperature of the first heating means 4 (heater 40) is low, the temperature of the curable composition to be ejected from the head 3 will take time to be increased to the desired second temperature T if the heating temperature of the second heating means 6 (heating device 60) is not rendered high. However, if the heating temperature of the second heating means 6 (heating device 60) is rendered excessively high, the temperature difference exceeds 65° C. and the above-described problem of the degradation of a curable composition will occur. On the other hand, if the heating temperature of the second heating means 6 (heating device 60) is not so high, there occurs a problem that the temperature of the curable composition to be ejected from the head 3 cannot be raised to the desired second temperature T, and the viscosity of the curable composition to be ejected from the head 3 becomes high, and as a result, there occurs a problem that the curable composition is difficult to be ejected from the head 3. Thus, the heating temperature of the first heating means 4 (heater 40) is preferably 40° C. or higher, more preferably 95° C. or lower, even more preferably 90° C. or lower.

Separately from the first channel 5, the second channel 7 connects the first tank 2 with the head 3 and allows the curable composition having not been ejected from the head 3 to return to the first tank 2. To the second channel 7 is connected the first pump 9, and the curable composition is pumped from the head 3 by the first pump 9 and is retained in the first tank 2 through the second channel 7. The second channel 7 is formed of a pipe made of, for example, resin or metal, a tube made of resin, or the like. The first and second channels 5, 7 form a circulation path connecting the first tank 2, the second pump 8, the second heating means 6, the head 3, and the first pump 9, and the curable composition is allowed to circulate through the circulation path.

The head 3, the heater 40 of the first heating means 4, the heater 62 of the second heating means 6, the temperature sensors, and the pumps 8, 9, each described above, are electrically connected to a controller, such as a computer, and their operation is controlled thereby. The controller controls energization to the heaters 40, 62 and thereby adjusts the heating temperatures of the first heating means 4 and the second heating means 6. Moreover, it drives the head 3 and the pumps 8, 9.

In the liquid ejection device 1 having the configurations described above, a curable composition supplied to the head 3 is heated by the two heating means, namely, the first heating means 4 and the second heating means 6, and is raised to a temperature at which the liquid composition comes to have a viscosity as low as the liquid composition can be ejected from the head 3. Accordingly, the curable composition is never heated excessively. As a result, the degradation of the curable composition can be prevented, and therefore, a high-quality curable composition can be stably ejected from the head 3 to a member to be coated, and as a result, a cured material layer can be formed in high precision. Moreover, since the temperature of the curable composition can be raised in a short time, the curable composition can be efficiently applied to a member to be coated. In addition, since the curable composition is never heated excessively, the first channel 5, the second channel 7, and the pumps 8, 9 can be prevented from deteriorating and the lives thereof can be prolonged.

Although the first embodiment of the present invention has been described above, specific embodiments of the present invention are not limited to the above-described embodiment. For example, although the above-described embodiment has a configuration in which the heater 40 is provided on the outer-wall surface of the first tank 2 as the first heating means 4, an embodiment may be configured such that a heater is sunk in a curable composition in the first tank 2, and a variety of other embodiments can be employed as long as a curable composition in the first tank 2 can be heated. Although the heating device 60 is employed as the second heating means 6, there may be configured a heat exchanger to heat a curable composition passing through the first channel 5 by performing heat exchange with a high temperature heat medium.

As depicted in FIG. 4, in another possible configuration, a switching valve 10 selectively switchable between supply of a curable composition passing through the first channel 5 to the head 3 and supply of it to the second channel 7 is provided downstream of the second heating means 6 of the first channel 5. The switching valve 10 is preferably one that is electrically driven and it is electrically connected to a controller. In this embodiment, the controller drives the switching valve 10 and the first channel 5 is connected to the second channel 7 in front of the head 3, so that a circulation path connecting the first tank 2, the second pump 8, the second heating means 6, and the first pump 9 is formed by the first and second channels 5, 7. This makes it possible to perform a warm-up operation of raising the temperature of a curable composition until the curable composition reaches a viscosity at which it can be ejected from the head 3 through circulation of the curable composition in the circulation path. If the warm-up operation is completed, the controller drives the switching valve 10 to connect the first channel 5 to the head 3, so that it becomes possible to perform application to a member to be coated. According to the present invention, since the temperature of a curable composition can be raised in a short time, the warm-up operation does not take a long time to be completed and users can be prevented from feeling uncomfortable. The pumps (the first pump 9 and the second pump 8) should just be connected to at least one of the first channel 5 and the second channel 7.

As depicted in FIG. 5, a second tank 11 to supply a curable composition to the first tank 2 is provided in a possible configuration. The first tank 2 and the second tank 11 are connected together by a third channel 12, and a curable composition can be fed continuously or intermittently from the second tank 11 to the first tank 2 via the third channel 12. The second tank 11 is an item with a configuration in which the top opening of a bottomed cylindrical body is covered with a lid, and it retains therein a curable composition. A third pump is connected to the third channel 12, and a curable composition is pumped from the second tank 11 to the first tank 2 by the third pump 13. The third channel 12 is formed of a pipe made of, for example, resin or metal, a tube made of resin, or the like.

In this embodiment, a curable composition is fed from the second tank 11 to the curable composition in the first tank 2 heated by the first heating means 4 (heater 40). Also in this embodiment, the heating temperature of the first heating means 4 (heater 40) is preferably 40° C. or higher, more preferably 95° C. or lower, even more preferably 90° C. or lower. The heating temperature of the second heating means 6 (heating device 60) is preferably adjusted to not lower than 45° C. and not higher than 110° C., more preferably not lower than 60° C. and not higher than 105° C., even more preferably adjusted to not lower than 65° C. and not higher than 105° C., more preferably not lower than 65° C. and not higher than 100° C., more preferably adjusted to not lower than 75° C. and not higher than 95° C., and more preferably adjusted to not lower than 80° C. and not higher than 95° C. The temperature difference between the heating temperature of the second heating means 6 (heating device 60) and the heating temperature of the first heating means 4 (heater 40) is not less than 5° C. and not more than 65° C., preferably not less than 5° C. and not more than 55° C., and more preferably not less than 5° C. and not more than 50° C. In this embodiment, since a curable composition is supplied to the first tank 2 at every convenience, the application of the curable composition to a member to be coated can be performed continuously for a long time.

Preferably, the head 3 has thereon or in contact therewith no heating means for heating the head 3 to any selected temperature. The reason for this is as follows: if the head 3 is heated by a heating means, a variation in the temperature of the head 3 is caused by heating ON/OFF by the heating means, and the ejected amount of a curable composition also varies depending upon the temperature variation and, as a result, it becomes difficult to accurately apply the curable composition to a member to be coated.

In the case of controlling the heating temperature of a curable composition using a temperature sensor (not shown), it is preferred, but is not particularly limited to, that a temperature sensor for measuring the head temperature is provided in the head 3 and the heating temperature of the second heating means is controlled on the basis of the temperature of the head 3 measured by that temperature sensor without directly controlling the heating temperature of the curable composition. In other words, it is preferred to control the degree of heat generation of the heat source of the second heating means such that the curable composition reaches a final target temperature. This is because when controlling the heating temperature of a curable composition with a temperature sensor for measuring the temperature of a curable composition in the liquid ejection device 1, a time lag occurs in the temperature sensor actually detecting the heating temperature of the curable composition especially when the temperature of the curable composition is low, and the curable composition may be heated (overheated) by the second heating means which has reached a temperature higher than necessary. Accordingly, even in the case of heating the curable composition to reach a prescribed temperature on the basis of the temperature of the head 3, it is preferable to control the temperature of the second heating means so as not to reach a temperature higher than necessary.

One specific example is a method in which the temperature of the head 3 is measured by a temperature sensor for measuring the head temperature provided in the head 3, and target heating temperatures of the first heating means 4 and the second heating means 6 are calculated by comparing that measured temperature and the target temperature of the head, and then the temperatures of the first heating means 4 and the second heating means 6 are controlled so as to become the target temperatures.

When the device has a plurality of ejection heads, the device preferably has branching for supplying an ink to the individual heads at a position closer to the heads than the second heating means. If the branching is located before the second heating means, it becomes necessary to have a plurality of the second heating means or a plurality of channels in the second heating means. If the device has a plurality of the second heating means, the number of components increases and the size of the device becomes large. In addition, it becomes necessary to control the plurality of the second heating means, resulting in complicated control. On the other hand, if the device has a plurality of channels in the second heating means, their heating ability varies if the channels are not identical in flow rate, and as a result, head temperature variation will occur and printing performance will be affected. In order to unify the channels in flow rate, it is necessary to make a uniform channel design and also consider even the residual amount of ink, resulting in complicated control. For this reason, it is preferred to feed an ink to individual heads at a position closer to the heads than the second heating means.

The present invention will be further described below with reference to examples. However, the present invention is not to be limited to the examples.

[Preparation of Thermocurable Composition]

Thirty parts by weight of a bisphenol A type epoxy compound (EXA 850CPR, produced by DIC Corporation), 50 parts by weight of a bisphenol F type epoxy compound (YDF-170, produced by Nippon Steel & Sumikin Chemical Co., Ltd.), and 20 parts by weight of an aliphatic epoxy compound (PETG, produced by Showa Denko K. K.) as thermocurable compounds, 100 parts by weight of a terpene-based acid anhydride compound (YH 309, produced by Mitsubishi Chemical Corporation) as a thermal curing agent, and 1 part by weight of a DBU-octylic acid salt (UCAT SA102, produced by San-Apro Ltd.) as a curing accelerator were uniformly mixed, affording a thermocurable composition.

[Preparation of Photocurable Composition]

Fifty parts by weight of trimethylolpropane triacrylate (TMPTA, produced by Daicel-Allnex Ltd.) and 50 parts by weight of tricyclodecanedimethanol diacrylate (IRR-214K, produced by Daicel-Allnex Ltd.) as photocurable compounds, 5 parts by weight of 2-benzyl-2-dimethylamino-4-morpholinobutyrophenone (IRGACURE 369, produced by BASF) as a photopolymerization initiator, and 1 part by weight of a DBU-octylic acid salt (UCAT SA102, produced by San-Apro Ltd.) as a curing accelerator were uniformly mixed, affording a photocurable composition.

Example 1

For the photocurable composition prepared as described above, the photocurable composition was ejected from a head by use of a liquid ejection device depicted in FIG. 4. First, a first channel was connected to a second channel in front of the head by use of a switching valve and a warm-up operation was performed for about 30 minutes. The heating temperature of a first heating means (a heater) at this time was 40° C. and the heating temperature of a second heating means (a heating device) was 80° C. After the completion of the warm-up operation, the first channel was connected to the head with the switching valve, and the photocurable composition was ejected to a member to be coated. The temperature of the head at the time of the ejection was 70° C. and the photocurable composition was able to be satisfactorily ejected from the head. When the photocurable composition ejected to the member to be coated from the head was visually checked, no changes (degradation) in properties, such as yellowing, were observed and a highly precise cured material layer had been formed.

Example 2

The photocurable composition was ejected to a member to be coated under the same conditions as in Example 1, except that the heating temperature of the second heating means (the heating device) at the time of the warm-up operation was changed to 95° C. The temperature of the head at the time of the ejection was 78° C. and the photocurable composition was able to be satisfactorily ejected from the head. When the photocurable composition ejected to the member to be coated from the head was visually checked, no changes (degradation) in properties, such as yellowing, were observed and a highly precise cured material layer had been formed.

Example 3

The photocurable composition was ejected to a member to be coated under the same conditions as in Example 1, except that the heating temperature by the second heating means (the heating device) at the time of the warm-up operation was changed to 105° C. The temperature of the head at the time of the ejection was 85° C. and the photocurable composition was able to be satisfactorily ejected from the head. When the photocurable composition ejected to the member to be coated from the head was visually checked, no changes (degradation) in properties, such as yellowing, were observed and a highly precise cured material layer had been formed.

Example 4

For the photocurable composition prepared as described above, the photocurable composition was ejected from a head by use of a liquid ejection device depicted in FIG. 5. First, first channel was connected to a second channel in front of the head by use of a switching valve and a warm-up operation was performed for about 10 minutes. The heating temperature of a first heating means (a heater) at this time was 90° C. and the heating temperature by a second heating means (a heating device) was 95° C. After the completion of the warm-up operation, the first channel was connected to the head with the switching valve, and the photocurable composition was ejected to a member to be coated. The temperature of the head at the time of the ejection was 80° C. and the photocurable composition was able to be satisfactorily ejected from the head. When the photocurable composition ejected to the member to be coated from the head was visually checked, no changes (degradation) in properties, such as yellowing, were observed and a highly precise cured material layer had been formed.

Example 5

The thermocurable composition was ejected to a member to be coated under the same conditions as in Example 4, except that coating was performed using the thermocurable composition prepared as described above. The temperature of the head at the time of the ejection was 80° C. and the thermocurable composition was able to be satisfactorily ejected from the head. When the thermocurable composition ejected to the member to be coated from the head was visually checked, no changes (degradation) in properties, such as yellowing, were observed and a highly precise cured material layer had been formed.

Comparative Example 1

For the photocurable composition prepared as described above, the photocurable composition was ejected from a head by use of a liquid ejection device depicted in FIG. 6. The liquid ejection device depicted in FIG. 6 is the same in configuration as the liquid ejection device depicted in FIG. 4 except for having no first heating means (a heater) for heating a photocurable composition in a first tank. First, a first channel was connected to a second channel in front of the head by use of a switching valve and a warm-up operation was performed for about 60 minutes. The heating temperature of a second heating means (a heating device) at this time was 105° C. After the completion of the warm-up operation, the first channel was connected to the head with the switching valve, and the photocurable composition was ejected to a member to be coated. The temperature of the head at the time of the ejection was 70° C. and the photocurable composition was able to be satisfactorily ejected from the head. However, when the photocurable composition ejected to the member to be coated from the head was visually checked, yellowing was observed. This yellowing is confirmed to be caused by the degradation of the photocurable composition.

Comparative Example 2

The photocurable composition was ejected to a member to be coated under the same conditions as in Comparative Example 1, except that the heating temperature of the second heating means (the heating device) at the time of the warm-up operation was changed to 95° C. The temperature of the head at the time of ejection was 65° C. and the viscosity of the photocurable composition had not been fully dropped. For this reason, the nozzle was clogged and the photocurable composition was not able to be ejected from the head.

Comparative Example 3

The thermocurable composition was ejected to a member to be coated under the same conditions as in Comparative Example 1, except that coating was performed using the thermocurable composition prepared as described above. The temperature of the head at the time of the ejection was 70° C., but the nozzle was clogged and the thermocurable composition was not able to be ejected from the head. The thermocurable composition recovered from the head confirmed that the viscosity was high and the viscosity increased. This was caused by the fact that a thermocurable composition is thickened if the heating time is prolonged (in this example, one hour), and it was confirmed that the heating time was preferably limited to 30 minutes or less.

Comparative Example 4

The photocurable composition was ejected to a member to be coated under the same conditions as in Example 1, except that the heating temperature of the first heating means (the heater) at the time of the warm-up operation was changed to 40° C. and the heating temperature of the second heating means (the heating device) was changed to 110° C., and the warm-up operation time was changed to about 10 minutes. The temperature of the head at the time of the ejection was 88° C. and the photocurable composition was able to be satisfactorily ejected from the head. However, when the photocurable composition ejected to the member to be coated from the head was visually checked, yellowing was observed. This yellowing is confirmed to be caused by the degradation of the photocurable composition.

The evaluation results of Examples 1 to 5 and Comparative Examples 1 to 4 described above are shown in Table 1. In the column of "Ejection result" of Table 1, "circle" indicates that the curable composition could be satisfactorily ejected from a nozzle, and "cross" indicates that the curable composition could not be ejected from a nozzle. In the column of "Warm-up operation time," "double circle" indicates that the warm-up operation time was 10 minutes or less, "circle" indicates that the warm-up operation time was 30 minutes or less, and "cross" indicates that the warm-up operation time was 60 minutes or more. In the column of "Yellowing," "circle" indicates that yellowing was not observed, and "cross" indicates that yellowing was observed.

TABLE 1

| | Heating temperature | | | | | | | |
| | First heating means | Second heating means | Temperature difference | Head temperature | Type of curable composition | Ejection result | Warm-up operation time | Yellowing |
| --- | --- | --- | --- | --- | --- | --- | --- | --- |
| Ex. 1 | 40° C. | 80° C. | Δ 40° C. | 70° C. | Photocurable composition | ○ | ○ | ○ |
| Ex. 2 | 40° C. | 95° C. | Δ 55° C. | 78° C. | Photocurable composition | ○ | ○ | ○ |
| Ex. 3 | 40° C. | 105° C. | Δ 65° C. | 85° C. | Photocurable composition | ○ | ○ | ○ |
| Ex. 4 | 90° C. | 95° C. | Δ 5° C. | 80° C. | Photocurable composition | ○ | ◎ | ○ |
| Ex. 5 | 90° C. | 95° C. | Δ 5° C. | 80° C. | Thermocurable composition | ○ | ◎ | ○ |
| Comp. Ex. 1 | — | 105° C. | — | 70° C. | Photocurable composition | ○ | Δ | X |
| Comp. Ex. 2 | — | 95° C. | — | 65° C. | Photocurable composition | X | Δ | — |
| Comp. Ex. 3 | — | 105° C. | — | 70° C. | Thermocurable composition | X | Δ | — |
| Comp. Ex. 4 | 40° C. | 110° C. | Δ 70° C. | 88° C. | Photocurable composition | ○ | ○ | X |

From Table 1, it can be confirmed that Examples 1 to 5 according to the present invention can apply a high quality curable composition more stably and more efficiently than Comparative Examples 1 to 3, in which there was employed only one heating means for heating a curable composition as described in the prior art document in the present description. It is confirmed that Examples 1 to 5 according to the present invention, in which the temperature difference between the heating temperature of the second heating means and the heating temperature of the first heating means is 65° C. or less, can apply a high quality curable composition more stably than Comparative Example 4, in which that temperature difference exceeds 65° C.

FIG. 7 and FIG. 8 are a plan view and a front view of a liquid heating device to be used in the liquid ejection device of the second embodiment of the present invention. FIG. 9 and FIG. 10 are a cross-sectional view taken along A-A line of FIG. 7 and a cross-sectional view taken along B-B line of FIG. 7, respectively.

In the first embodiment, the heater 40 was used as a heating device as the first heating means 4 and the heating device 60 was provided as the second heating means 6. In contrast to this, in the second embodiment, a liquid heating device 60A depicted in FIG. 7 to FIG. 10 is used instead of the heating device 60 described above. Other configurations of the second embodiment are the same as those of the first embodiment.

The liquid heating device 60A has a thermal conductor 61 having therein a channel 64X through which a liquid passes, and a heater 62 which heats the liquid which passes through the channel 64X via the thermal conductor 61. The liquid heating device 60A may further have a temperature sensor (not shown). This temperature sensor is preferably provided in the thermal conductor 61, and it is preferred to detect the temperature of the liquid passing through the channel with the temperature sensor. Also in the liquid heating device 60A, the thermal conductor 61 has a pair of thermally conductive plates 61A, 61B as in the liquid heating device 60. These thermally conductive plates 61A, 61B have the same structure as in the liquid heating device 60. Also in this embodiment, a recessed groove 64 is formed on a surface, namely, the inside surface of one thermally conductive plate 61A, which faces the other thermally conductive plate 61B.

In the surface of one or the other of the thermally conductive plates 61A, 61B, an inlet port 65 and an outlet port 66 are provided. The groove 64 constitutes the channel 64X, and the channel 64X is formed of a space defined by an interior surface of the groove 64, namely, a bottom surface 64b, both side surfaces 64c, 64d (shown in FIG. 11), and a rear surface 64e of the other thermally conductive plate 61B in this embodiment. The rear surface 64e covers the groove 64. The channel 64X extends from the inlet port 65 to the outlet port 66, and one end and the other end of the channel 64X are interconnected to the inlet port 65 and the outlet port 66, respectively. To the inlet port 65 is fixed a tube 65A for supplying a liquid, and to the outlet port 66 is fixed a tube 66A for discharging the liquid; the liquid is introduced into the channel 64X in the thermal conductor 61 from the inlet port 65 and is discharged from the outlet port 66 after passing through the channel 64X. When the liquid passes through the channel 64X, the heat of the heater 62 is transmitted to the liquid in the channel 64X via the thermal conductor 61 and the liquid is heated by heat conduction, and thus the temperature of the liquid increases. At this time, it is possible to bring the liquid to a desired temperature by controlling the heating temperature of the heater 62 while checking the temperature detected by a temperature sensor.

The pair of thermally conductive plates 61A, 61B allow a sealing member 68, such as a packing and an O ring, to intervene therebetween to surround the circumference of the channel 64X A frame-shaped recess 61a recessed in a concave manner is formed on the outer periphery side of the rear surface of one thermally conductive plate 61A, and the sealing member 68 is fitted in this recess 61a. The channel 64X is fluidly sealed with this sealing member 68.

The channel 64X is formed in a winding shape in this embodiment. That is, the groove 64 is formed such that a straight part 64A and a folded part 64B may be formed in an alternating and sequential fashion, and a plurality of straight parts 64A are arranged in parallel via a partition part 64C. One end and the other end of adjacent straight parts 64A are interconnected in an alternating fashion via the folded part 64B. Since a wide area in which a liquid comes into thermal contact with the thermal conductor 61 via the channel 64X can be secured by forming the channel 64X in a winding shape and thereby elongating the channel 64X, the heat of the heater 62 can, in association therewith, be transmitted fully and uniformly to the liquid via the thermal conductor 61.

The shape of the channel 64X is not particularly limited, and the shape in cross-sectional view can be a variety of shapes such as triangular shapes, rectangular shapes, such as a square shape and rectangular shapes, polygonal shapes, trapezoidal shapes, a semi-circular shape, semi-elliptical shapes, and a circular shape; a rectangular shape is employed in this embodiment. In order to increase the heat transfer efficiency by heat conduction relative to the liquid passing through the channel 64X, the surface area (specific surface area) per unit volume of the channel 64X is adjusted to 1.15 $mm^2/mm^3$ or more, preferably adjusted to 1.50 $mm^2/mm^3$ or more, more preferably adjusted to 1.80 $mm^2/mm^3$ or more, and even more preferably adjusted to 2.00 $mm^2/mm^3$ or more. Since the area of the interior surface of the channel 64X, which comes into contact with a liquid and contributes to heat conduction to the liquid, is sufficiently large if the surface area of the channel 64X per unit volume is 1.15 $mm^2/mm^3$ or more, the heat of the heater 62 can be efficiently transmitted to the fluid passing through the channel 64X via the thermal conductor 61. Accordingly, since the liquid passing through the channel 64X can be heated to a desired temperature in a short time, the length of the channel 64X can be shortened. Since the size of the thermal conductor 61 can also thereby be reduced, the size of the liquid heating device 60A itself and the size of the liquid ejection device comprising this liquid heating device 60A itself can also be reduced.

The surface area and the volume of the channel 64X are geometric surface area and volume and are not a surface area and a volume including irregularities on a microscopic level, and they are a surface area and a volume calculated using numerical values measured from the shape of the channel 64X. Since the shape of the channel 64X is defined by the interior surface of the groove 64, i.e., the bottom surface 64b and the left and right side surfaces 64c, 64d, and the rear surface 64e of the other thermally conductive plate 61B, the surface area $S_v$ of the channel 64X per unit volume is represented by $S_v=L/S$ where the area in cross-sectional view (cross-sectional area) of the channel 64X is denoted by S and the peripheral length of the channel 64X in cross-sectional view is denoted by L. In a specific description, when the channel 64X is in a rectangular shape or a square shape in cross-sectional view as in this embodiment (FIG. 11), the channel width d1 of the channel 64X in the transverse direction is the distance between the side surface 64c and the side surface 64d. The channel width d2 of the channel 64X in the longitudinal direction is a distance between the plane 64b and the rear surface 64e of the thermally conductive plate 61B. In this case, the product (d1×d2) of the channel width d1 of the channel 64X in the transverse direction and the channel width d2 in the longitudinal direction is the cross-sectional area S of the channel 64X, and the sum (2d1+2d2) of the channel width d1 in the transverse direction and the channel width d2 in the longitudinal direction is the peripheral length L of the channel 64X. Accordingly, the surface area $S_v$ per unit volume of the channel 64X is represented by $S_v=L/S=(2d1+2d2)/(d1×d2)$. Also in the case where the shape of the channel 64X in cross-sectional view is a triangular shape, a polygonal shape, a trapezoidal shape, a semi-circular shape, a semi-elliptical shape, a circular shape, or the like, the surface area $S_v$ of the channel 64X per unit volume can be calculated by the same manner.

The channel 64X preferably has a flat shape in cross-sectional view. That is, the channel 64X is formed in a shape with small width or thickness, in which the channel width d1 in the transverse direction and the channel width d2 in the longitudinal direction in cross-sectional view differ in the size greatly. In this embodiment, the channel 64X is formed in a shape with small thickness, in which the channel width d1 in the transverse direction is larger than the channel width d2 in the longitudinal direction in cross-sectional view. For example, when the channel 64X is in a circular shape in cross-sectional view, the surface area $S_v$ per unit volume can be made equal to or larger than 1.15 $mm^2/mm^3$ by making the diameter of the channel 64X small, and heat can be transmitted efficiently to the fluid passing through the channel 64X via the thermal conductor 61. On the other hand, if the diameter of the channel 64X becomes excessively small, the frictional resistance of the channel 64X becomes large, and as a result, a large amount of energy (pressure) will be required to make a liquid, especially, a liquid having a viscosity, pass through the channel 64X, and so called pressure loss may become large. In contrast to this, if the channel 64X has a flat cross-sectional shape, it is possible to make the surface area $S_v$ per unit volume equal to or larger than 1.15 $mm^2/mm^3$ without making the size in cross-sectional view of the channel 64X excessively small, and therefore, the pressure loss of the channel 64X can be suppressed.

Moreover, as to the flatness of the channel 64X, the ratio of the channel width in the first direction in which the size is the longest (the channel width d1 of the transverse direction in cross-sectional view when the channel 64X is formed in a flat shape with small thickness as in this embodiment) to the channel width in the second direction which is perpendicular to the first direction (the channel width d2 in the longitudinal direction in cross-sectional view in this embodiment) is preferably 1.2 or more, more preferably 1.5 or more, even more preferably 3.0 or more, and more preferably 8.0 or more. Thereby, the pressure loss of the channel 64X is reduced greatly and heat can be efficiently transmitted to a liquid. The channel width means the length between both ends furthest from each other in each of the first direction and the second direction of the channel 64X.

As to the channel width of the channel 64X, the channel width in the second direction perpendicular to the first direction in which the size is the longest (the channel width d2 in the longitudinal direction in cross-sectional view in this embodiment) is preferably adjusted to 0.1 mm or more, more preferably adjusted to 0.2 mm or more, even more preferably adjusted to 0.3 mm or more, and even more preferably adjusted to 0.5 mm because if it is excessively small, the frictional resistance (pressure loss) of the channel 64X will be large and a liquid will readily stay at an end of the channel 64X. The channel width in the first direction in which the size is the longest (the channel width d1 in the transverse direction in cross-sectional view in this embodiment) is preferably adjusted to 60.0 mm or less, more preferably adjusted to 50.0 mm or less, even more preferably adjusted to 30.0 mm or less, even more preferably adjusted to 20.0 mm or less, and even more preferably adjusted to 10.0 mm because if it is excessively large, the replaceability will be poor and the size of the thermal conductor 61 will be large. The phrase "replaceability is poor" means that if the channel width d1 of the channel 64X is large, the amount of a liquid which attaches to the inside of the channel 64X to remain will increase and therefore it is necessary to wash the channel 64X repeatedly in order to exchange the liquid, and therefore time and efforts will be taken, and if the channel width d1 of the channel 64X is large, since the volume of the channel 64X is large, the amount of a liquid necessary for washing increases to lead to an increased cost, resulting in poor efficiency.

When the thermal conductor 61 has been formed with two thermally conductive plates 61A, 61B being stacked as in this embodiment, the channel 64X is formed by covering a recessed groove 64 of one thermally conductive plate 61A with the other thermally conductive plate 61B. In this case, if a liquid passing through the groove 64 lands on the side surface 64c of the groove 64, namely, the partition part 64C, the liquid may enter and clog between the two thermally conductive plates 61A, 61S. If the liquid clogs between the two thermally conductive plates 61A, 61B, there is a problem that in the case of exchanging the type of the liquid to heat, a long time is required to remove the clog of the liquid and a large amount of a liquid for washing is required when the channel 64X is washed by flowing the liquid for washing in the channel 64X. For this reason, it is preferred that at least a part of each partition part 64C disposed between adjacent straight parts 64A of the groove 64 has a gap S1 between its top end and the other thermally conductive plate 61B covering the groove 64. In other words, it is preferred that the top end surface of each partition part 64C does not abut on the rear surface of the other thermally conductive plate 61B and the adjacent straight parts 64A of the groove 64 interconnect with each other at the top end of a partition part 64C. This prevents the liquid passing through the groove 64 from clogging between the two thermally conductive plates 61A, 61B, and washing the channel 64X in exchanging the type of the liquid to heat can be performed efficiently in a short time. The size of the gap S1 may be small in comparison with the channel width d2 of the channel 64X in the longitudinal direction in cross-sectional view, and it is preferably adjusted to 0.05 mm to 0.5 mm, more preferably adjusted to 0.05 mm to 0.3 mm.

According to the liquid heating device 60A with the configurations described above, since the surface area $S_v$ per unit volume of the channel 64X through which a liquid passes is 1.15 $mm^2/mm^3$ or more, the area of the interior surface of the channel 64X, which comes into contact with a liquid and contributes to heat conduction to the liquid, is sufficiently large. Accordingly, since the heat transfer efficiency by heat conduction to a liquid passing through the channel 64X can be increased, the fluid passing through the channel 64X can be efficiently heated by the heat from the heater 62. As a result, since the liquid passing through the channel 64X can be heated to a desired temperature in a short time, the length of the channel 64X can be shortened and the size of the thermal conductor 61, and even the size of the liquid heating device 60A itself can be reduced.

If the channel 64X has a flat cross-sectional shape, the pressure loss of the channel 64X can be suppressed better in a flat shape as compared with the case of a channel 64X being in a circular shape in cross-sectional view if they are of the same volume, and therefore, improvement in heat transfer efficiency and reduction in pressure loss can be attained at the same time.

Moreover, since at least a part of each partition part 64C disposed between adjacent straight parts 64A of the groove 64 constituting the channel 64X has a gap S1 between its top end and the other thermally conductive plate 61B covering the groove 64, the liquid passing through the channel 64X can be prevented from clogging between two thermally conductive plates 61A, 61B. In the case of exchanging the type of the liquid to heat, washing can be performed efficiently in a short time when the channel 64X is washed by flowing a liquid for washing.

Although the liquid heating device 60A has been described above, specific embodiments of a liquid heating device are not limited to the above-described embodiment. For example, in the above-described embodiment, the thermal conductor 61 has been formed with the two thermally conductive plates 61A, 61B stacked together, but it can also be formed using a single block-shaped plate. Moreover, the channel 64X has been formed in a winding shape, but the channel is not necessarily required to be in a winding shape and it may be formed in a variety of shapes, such as a straight line shape and a spiraled shape.

The liquid ejection device of the second embodiment will be further described below using Examples. However, the liquid ejection device of the second embodiment is not limited to the following Examples.

[Preparation of Thermocurable Composition]

Thirty parts by weight of a bisphenol A type epoxy compound (EXA 850CPR, produced by DIC Corporation), 50 parts by weight of a bisphenol F type epoxy compound (YDF-170, produced by Nippon Steel & Sumikin Chemical Co., Ltd.), and 20 parts by weight of an aliphatic epoxy compound (PETG, produced by Showa Denko K.K.) as thermocurable compounds, 100 parts by weight of a terpene-based acid anhydride compound (YH 309, produced by Mitsubishi Chemical Corporation) as a thermal curing agent, and 1 part by weight of a DBU-octylic acid salt (UCAT SA102, produced by San-Apro Ltd.) as a curing accelerator were uniformly mixed, affording a thermocurable composition.

[Preparation of Photocurable Composition]

Fifty parts by weight of trimethylolpropane triacrylate (TMPTA, produced by Daicel-Allnex Ltd.) and 50 parts by weight of tricyclodecanedimethanol diacrylate (IRR-214K, produced by Daicel-Allnex Ltd.) as photocurable compounds, 5 parts by weight of 2-benzyl-2-dimethylamino-4-morpholinobutyrophenone (IRGACURE 369, produced by BASF) as a photopolymerization initiator, and 1 part by weight of a DBU-octylic acid salt (UCAT SA102, produced by San-Apro Ltd.) as a curing accelerator were uniformly mixed, affording a photocurable composition.

Example 6

For the photocurable composition prepared as described above, the photocurable composition was ejected from a head by use of a liquid ejection device depicted in FIG. 4. It is noted that a liquid heating device 60A according to the second embodiment was used as a liquid heating device as the second heating means 6. First, a supply channel was connected to a return channel in front of the head by use of a switching valve and a warm-up operation was performed for about 30 minutes. The heating temperature of a heating means (a heater) at this time was 40° C. and the heating temperature of the liquid heating device was 80° C. After the completion of the warm-up operation, the supply channel was connected to the head with the switching valve, and the photocurable composition was ejected to a member to be coated. The temperature of the head at the time of the ejection was 70° C. and the photocurable composition was able to be satisfactorily ejected from the head. When the photocurable composition ejected to the member to be coated from the head was visually checked, no changes (degradation) in properties, such as yellowing, were observed and a highly precise cured material layer had been formed.

Example 7

The photocurable composition was ejected to a member to be coated under the same conditions as in Example 6, except that the heating temperature of the liquid heating device at the time of the warm-up operation was changed to 95° C. The temperature of the head at the time of the ejection was 78° C. and the photocurable composition was able to be satisfactorily ejected from the head. When the photocurable composition ejected to the member to be coated from the head was visually checked, no changes (degradation) in properties, such as yellowing, were observed and a highly precise cured material layer had been formed.

Example 8

The photocurable composition was ejected to a member to be coated under the same conditions as in Example 6, except that the heating temperature of the liquid heating device at the time of the warm-up operation was changed to 105° C. The temperature of the head at the time of the ejection was 85° C. and the photocurable composition was able to be satisfactorily ejected from the head. When the photocurable composition ejected to the member to be coated from the head was visually checked, no changes (degradation) in properties, such as yellowing, were observed and a highly precise cured material layer had been formed.

Example 9

For the photocurable composition prepared as described above, the photocurable composition was ejected from a head by use of a liquid ejection device depicted in FIG. 5. It is noted that a liquid heating device 60A according to the second embodiment was used as a liquid heating device constituting the second heating means 6. First, a supply channel was connected to a return channel in front of the head by use of a switching valve and a warm-up operation was performed for about 10 minutes. The heating temperature of a heating means (a heater) at this time was 90° C. and the heating temperature of the liquid heating device was 95° C. After the completion of the warm-up operation, the supply channel was connected to the head with the switching valve, and the photocurable composition was ejected to a member to be coated. The temperature of the head at the time of the ejection was 80° C. and the photocurable composition was able to be satisfactorily ejected from the head. When the photocurable composition ejected to the member to be coated from the head was visually checked, no changes (degradation) in properties, such as yellowing, were observed and a highly precise cured material layer had been formed.

Example 10

The thermocurable composition was ejected to a member to be coated under the same conditions as in Example 9, except that coating was performed using the thermocurable composition prepared as described above. The temperature of the head at the time of the ejection was 80° C. and the thermocurable composition was able to be satisfactorily ejected from the head. When the thermocurable composition ejected to the member to be coated from the head was visually checked, no changes (degradation) in properties, such as yellowing, were observed and a highly precise cured material layer had been formed.

Comparative Example 5

For the photocurable composition prepared as described above, the photocurable composition was ejected from a head by use of a liquid ejection device depicted in FIG. 6. The liquid ejection device depicted in FIG. 6 is the same in configuration as the liquid ejection device depicted in FIG. 4 except for having no heating means (a heater) for heating a photocurable composition in a tank. First, a supply channel was connected to a return channel in front of the head by use of a switching valve and a warm-up operation was performed for about 60 minutes. The heating temperature of a liquid heating device at this time was 105° C. After the completion of the warm-up operation, the supply channel was connected to the head with the switching valve, and the photocurable composition was ejected to a member to be coated. The temperature of the head at the time of the ejection was 70° C. and the photocurable composition was able to be satisfactorily ejected from the head. However, when the photocurable composition ejected to the member to be coated from the head was visually checked, yellowing was observed. This yellowing is confirmed to be caused by the degradation of the photocurable composition.

Comparative Example 6

The photocurable composition was ejected to a member to be coated under the same conditions as in Comparative Example 5, except that the heating temperature of the liquid heating device at the time of the warm-up operation was changed to 95° C. The temperature of the head at the time of ejection was 65° C. and the viscosity of the photocurable composition had not been fully dropped. For this reason, the photocurable composition was not able to be ejected from the head.

Comparative Example 7

The thermocurable composition was ejected to a member to be coated under the same conditions as in Comparative Example 5, except that coating was performed using the thermocurable composition prepared as described above. The temperature of the head at the time of the ejection was 70° C., but the thermocurable composition was not able to be ejected from the head. The thermocurable composition recovered from the head confirmed that the viscosity was high and the viscosity increased. This was caused by the fact that a thermocurable composition is thickened if the heating time is prolonged (in this example, one hour), and it was confirmed that the heating time was preferably limited to 30 minutes or less.

Comparative Example 8

The photocurable composition was ejected to a member to be coated under the same conditions as in Example 6, except that the heating temperature of the heating means at the time of the warm-up operation was changed to 40° C. and the heating temperature of the liquid heating device was changed to 110° C., and the warm-up operation time was changed to about 10 minutes. The temperature of the head at the time of the ejection was 88° C. and the photocurable composition was able to be satisfactorily ejected from the head. However, when the photocurable composition ejected to the member to be coated from the head was visually checked, yellowing was observed. This yellowing is confirmed to be caused by the degradation of the photocurable composition.

The evaluation results of Examples 6 to 10 and Comparative Examples 5 to 8 described above are shown in Table 2. In the column of "Ejection result" of Table 2, "circle" indicates that the curable composition could be satisfactorily ejected from a nozzle, and "cross" indicates that the curable composition could not be ejected from a nozzle. In the column of "Warm-up operation time," "double circle" indicates that the warm-up operation time was 10 minutes or less, "circle" indicates that the warm-up operation time was 30 minutes or less, and "cross" indicates that the warm-up operation time was 60 minutes or more. In the column of "Yellowing," "circle" indicates that yellowing was not observed, and "cross" indicates that yellowing was observed.

TABLE 2

| | Heating temperature | | Temperature difference | Head temperature | Type of curable composition | Ejection result | Warm-up operation time | Yellowing |
| --- | --- | --- | --- | --- | --- | --- | --- | --- |
| | First heating means | Second heating means | | | | | | |
| Ex. 6 | 40° C. | 80° C. | Δ 40° C. | 70° C. | Photocurable composition | ○ | ○ | ○ |
| Ex. 7 | 40° C. | 95° C. | Δ 55° C. | 78° C. | Photocurable composition | ○ | ○ | ○ |
| Ex. 8 | 40° C. | 105° C. | Δ 65° C. | 85° C. | Photocurable composition | ○ | ○ | ○ |
| Ex. 9 | 90° C. | 95° C. | Δ 5° C. | 80° C. | Photocurable composition | ○ | ◎ | ○ |
| Ex. 10 | 90° C. | 95° C. | Δ 5° C. | 80° C. | Thermocurable composition | ○ | ◎ | ○ |
| Comp. Ex. 5 | — | 105° C. | — | 70° C. | Photocurable composition | ○ | Δ | X |
| Comp. Ex. 6 | — | 95° C. | — | 65° C. | Photocurable composition | X | Δ | — |
| Comp. Ex. 7 | — | 105° C. | — | 70° C. | Thermocurable composition | X | Δ | — |
| Comp. Ex. 8 | 40° C. | 110° C. | Δ 70° C. | 88° C. | Photocurable composition | ○ | ○ | X |

From Table 2, it can be confirmed that Examples 6 to 10 according to the liquid ejection device of the present invention can apply a high quality curable composition more stably and more efficiently than Comparative Examples 5 to 7, in which there was employed only one heating means for heating a curable composition as described in the prior art document in the present description. It is confirmed that Examples 6 to 10 according to the liquid ejection device of the present invention, in which the temperature difference between the heating temperature of the liquid heating device and the heating temperature of the heating means is 65° C. or less, can apply a high quality curable composition more stably than Comparative Example 8, in which that temperature difference exceeds 65° C.

In the liquid ejection device according to the present invention, there may be used a buffer tank 107 which will be explained with reference to FIG. 12 to FIG. 14. FIG. 12 is a schematic view illustrating a configuration in which the buffer tank 107 is connected to a channel 7, as a third embodiment of the present invention. In FIG. 12, the buffer tank 107 is connected between the pump 9 and the head 3 in the liquid ejection device of the FIG. 1, which illustrates the first embodiment. The liquid ejection device of the third embodiment is the same in the other configurations as that of the liquid ejection device depicted in FIG. 1. The channel part upstream of the buffer tank 107 has a first tubing segment 112a. The channel part downstream of the buffer tank 107 has a second tubing segment 112b. The buffer tank 107 has an upper surface 107a and a lower surface 107b.

The buffer tank 107 temporarily retains the liquid supplied and then supplies the liquid to the downstream side. The buffer tank 107 thereby controls the transmission of the pulsation of the liquid caused by the pump.

FIG. 13 is a partially broken-away front cross-sectional view illustrating a buffer tank and its environs in the third embodiment.

The first tubing segment 112a connects the head 3 depicted in FIG. 1 with the buffer tank 107.

The first tubing segment 112a extends beyond the upper surface 107a of the buffer tank 107 and into the buffer tank 107. Accordingly, an end 112a1 of the first tubing segment 112a on the buffer tank 107 side is located within the buffer tank 107.

To the lower surface 107b of the buffer tank 107 is connected a second tubing segment 112b for delivering a liquid from the buffer tank 107 to the downstream side of the buffer tank 107. The second tubing segment 112b connects the pump 9 depicted in FIG. 1 with the buffer tank 107. An end 112b1 of the second tubing segment 112b on the buffer tank 107 side is connected to the lower surface 107b of the buffer tank 107.

The end of the first tubing segment 112a should just be located above the end of the second tubing segment 112b on the buffer tank side.

The second tubing segment 112b is connected to the lower surface 107b of the buffer tank 107. This allows a liquid to be discharged easily. This will hereafter be described.

In a buffer tank 137 of Reference Example illustrated in FIG. 14, first and second tubing segments 132a, 132b are connected to an upper surface 137a. A lower surface 137b of the buffer tank 137 has no projections. For example, when a liquid curable composition or a liquid is exchanged, it is necessary to completely discharge the liquid to be exchanged from the buffer tank 137. At this time, the liquid has conventionally been discharged with the buffer tank 137 being removed from the liquid ejection device. Therefore, the production efficiency was low.

In addition, when the liquid is discharged from the buffer tank 137 as described above, the liquid has been discharged from the side of the upper surface 137a of the buffer tank 137. For this reason, the liquid has attached also near the upper surface 137a. Accordingly, it was difficult to fully remove the liquid attaching to the buffer tank 137 unless the buffer tank 137 was removed from the liquid ejection device and then washed. The washing was particularly difficult when the viscosity of the liquid was high. The washing with the removal from the liquid ejection have required an additional facility for the washing.

In contrast to this, in the buffer tank 107, the second tubing segment 112b is connected to the lower surface 107b of the buffer tank 107 as depicted in FIG. 13. This makes it possible to discharge the liquid easily without removing the buffer tank 107 from the liquid ejection device 1 depicted in FIG. 1.

Since the posture of the buffer tank 107 is kept constant even during the discharge of the liquid, the liquid hardly attaches to the upper surface 107a of the buffer tank 107. Accordingly, it is possible to wash the buffer tank 107 simultaneously with washing the pipes of the liquid ejection device without removing the buffer tank 107 from the liquid ejection device.

As depicted in FIG. 13, the lower surface 107b of the buffer tank 107 of this embodiment has a projection 107bA, which projects downwardly. The projection 107bA has a conical shape. The second tubing segment 112b is connected to the vertex of the projection 107bA. In this embodiment, the end 112b1 of the second tubing segment 112b is connected to the projection 107bA. Thus, it is possible to always keep the liquid in contact with the end 112b1 of the second tubing segment 112b by leaving the liquid at least within the projection 107bA. Accordingly, gas bubbles are hardly entrained in the liquid and the projection 107bA allows a smaller amount of liquid to be used in order to keep the end 112b1 in contact with the liquid.

In addition, if the supply of the liquid is stopped, liquid residue in the buffer tank 107 hardly occurs. Accordingly, this allows a smaller amount of the washing liquid necessary for washing.

The end of the second tubing segment may not necessarily be connected to the lower surface of the buffer tank. For example, the end of the second tubing segment may be located within the projection of the lower surface of the buffer tank in the height direction. The end 112b1 is, however, preferably connected to the projection 107bA as in this embodiment.

The shape and the position of the projection of the lower surface of the buffer tank are not particularly limited. For example, the entire bottom surface of the buffer tank may slope to be convex. In this case, the position of the vertex of the projection of the lower surface of the buffer tank is not particularly limited. For example, the vertex of the projection may be located on the side surface of the buffer tank.

In this embodiment, the second tubing segment 112b extends perpendicularly to the lower surface 107b of the buffer tank 107 from the vertex of the projection 107bA of the lower surface 107b. The direction along which the second tube extends is not particularly limited. For example, the second tube may extend from the vertex along the direction inclining from the direction perpendicular to the lower surface.

The lower surface of the buffer tank 107 may not necessarily have a projection.

The buffer tank 107 may be provided with an air hole in the upper part 107a of the buffer tank 107 in order to adjust the amount of the air in the tank and thereby to adjust the height of the surface of the liquid in the tank.

In the absence of the air hole, the height of the surface of the liquid in the tank cannot be freely adjusted because the amount of the air remaining in the tank is constant (the liquid surface is fixed). In contrast to this, the provision of an air hole makes it possible to adjust the height of the liquid surface by adjusting (increasing or decreasing) the amount of the air remaining in the tank.

For example, by discharging a certain amount of air through the air hole and thereby raising the liquid surface in the tank, it becomes easy to perform separation of gas bubbles in the buffer tank 107.

The amount of air intake and discharge through the air hole can be adjusted such that the height of the liquid surface is kept at a fixed height by providing a liquid surface sensor for measuring the height of the liquid surface in the buffer tank 107.

The end 112*a*1 of the first tubing segment 112*a* is located within the buffer tank 107. This can reduce impact when the liquid comes into contact with the lower surface 107*b* of the buffer tank 107 during supplying of the liquid into the buffer tank 107. Thus, the liquid hardly scatters during the supplying. Accordingly, it is possible to easily perform washing.

Preferably, the distance between the end 112*a*1 of the first tubing segment 112*a* and the end 112*b*1 of the second tubing segment 112*b* is 5 mm or more, more preferably 10 mm or more. This can sufficiently inhibit the pulsation of the pump 9 from transmitting upstream of the buffer tank 107.

Although the details of the reason are unknown, in the case that the buffer tank 107 was used, the pump 9 was hardly clogged with solid matter or the like and failures hardly occurred. Accordingly, the life of the pump can be prolonged.

On the other hand, also in the case of having used the buffer tank 107 by connecting it to the upstream side of the head 3, which was different from this embodiment, failures in the head 3 hardly occurred as in the pump 9. Accordingly, the life of an inkjet head can also be prolonged by the use of the buffer tank 107.

FIG. 15 is a diagram illustrating the schematic configuration of a major part of the liquid ejection device according to the fourth embodiment of the present invention. The liquid ejection device of the fourth embodiment is the same as the channel ejection device 1 of the first embodiment except that pressure sensors 108, 117 are connected to the first channel 5 and the second channel 7. In FIG. 15, the pressure sensor 108 is connected to the first channel 5 upstream of the head 3. In addition, the pressure sensor 117 is connected to the second channel 7 downstream of the head 3.

The pressure sensors 108, 117 are provided in order to detect the pressure of the liquid that is transferred within the first and second channels 5, 7. Alternatively, only one of the pressure sensors 108, 117 may be provided. Moreover, one or more additional pressure sensors may be provided instead of the pressure sensors 108, 117.

Hereafter, the pressure sensor 108 will representatively be described.

The structure of the pressure sensor 108 is not particularly limited.

That is, any appropriate pressure sensor with a pressure sensing face can be used. FIGS. 16(*a*) and 16(*b*) are a perspective view illustrating the appearance of the pressure sensor 108 and a schematic cross-sectional view of the pressure sensor 108.

The pressure sensor 108 has a cylindrical shape. The pressure sensor 108 has a diaphragm. The outer side surface of the diaphragm is a pressure sensing face 108*a*. In the diaphragm, there is provided a sensor element 108*b* to output electrical signals according to the pressure added to the pressure sensing face 108*a*.

The pressure sensor 117 also has the same structure.

The feature of this embodiment is that the pressure sensing face 108*a* is located within a range up to 1 mm from the same plane as the inner channel surface of the channel part, to which the pressure sensor 108 is attached, to the outside from the inner channel surface. This will be explained with reference to FIGS. 17(*a*) and 17(*b*).

FIG. 17 is a schematic partially broken-away front view of the part where the pressure sensor 108 is provided and (b) is a schematic cross-sectional view of the channel 5 viewed in the transverse cross-sectional direction thereof. In FIGS. 17(*a*) and 17(*b*), the direction in which a liquid flows in the channel 5 is defined as the X axis direction, the direction directed upwardly above the channel 5 is defined as the z axis direction, and the direction perpendicular to the x axis and the z axis is defined as the y direction. Accordingly, the y direction is the width direction of the channel 5.

As depicted in FIG. 17(*a*), the distance between the pressure sensing face 108*a* of the pressure sensor 108 and the inner channel surface 5*x* of a portion of the channel 5, to which the pressure sensor 108 is attached is defined as R. The outer side surface of the pressure sensing face 108*a* is defined to be a range up to 1 mm from the same plane as the inner channel surface 5*x* to the outside from the inner channel surface 5*x*. Accordingly, the distance R is limited to 1 mm or less.

In this case, a distance R2 shown in FIG. 17(*b*) is also limited to 1 mm or less. That is, also in the z axis direction, the distance R2 between the inner channel surface 5*z* and the pressure sensing face 108*a* is limited to 1 mm or less. The pressure sensing face 108*a* is located in a range up to 1 mm from the same plane as the inner channel surface 5*z* to the outside from the inner channel surface 5*z*, namely, in a range up to 1 mm downwardly.

In this embodiment, since the pressure sensing face 108*a* of the pressure sensor 108 is located as described above, the space 5*s* between the pressure sensing face 108*a* and the inner channel surface 5*x* or the inner channel surface 5*z* is very small. For this reason, when exchange to a new liquid is carried out after printing with the liquid ejection device 1, the amount of the liquid remaining outside the pressure sensing face 108*a* is small. Therefore, even if a liquid with a high viscosity is used, for example, as an ink, the liquid can be exchanged quickly and easily.

Preferably, it is preferred that the distances R and R2 are as small as possible, and more preferably, it is desired that the pressure sensing face 108*a* is located in plane with the inner channel surface 5*x* or the inner channel surface 5*z*.

FIG. 17(*c*) corresponds to a modified example of this embodiment and is a cross-sectional view of the channel 5 viewed in the transverse cross-sectional direction thereof like FIG. 17(*b*). Here, corner parts 5*d*1 to 5*d*4 in a transverse cross section of the channel 5 and corner parts 5*d*5, 5*d*6 between the channel 5 and the space 5*s* are rounded. Especially, it is preferred that the corner parts 5*d*5, 5*d*6 are rounded. Owing to this, the previously used liquid remaining in the space 5*s* is rapidly introduced into the channel 5 and the exchange of a liquid can be performed more easily and quickly.

FIGS. 18(*a*) and 18(*b*) are a schematic front view illustrating the relationship between the channel 5 and the pressure sensor 108 and a diagram illustrating the relationship between the channel 5 and the pressure sensor 108 viewed in the transverse cross-sectional direction of the channel 5 in still another embodiment of the present invention.

In this embodiment, there is no space 5*s*. That is, the pressure sensing face 108*a* is located in plane with the inner channel surfaces 5*x*, 5*z* in a portion to which the pressure sensor 108 is attached. In such a manner, it is more preferred that the inner channel surfaces 5*x*, 5*z* and the pressure sensing face 108*a* are located in the same plane. In this case, there is no space 5*s* (refer to FIG. 17(*a*)) in which the previously used liquid remains. Accordingly, exchange to a new liquid can be performed more easily and quickly.

"In the same plane" includes not only "in the same flat plane" but also "in the same curved plane."

FIG. 18(c) is a cross-sectional view taken along the transverse cross-sectional direction of the channel 5 for explaining a preferred modified example of the channel 5.

As depicted in FIG. 18(c), it is more preferred that the inner side of corner parts 5d7 to 5d10 in the transverse cross section of the channel 5 is rounded. In this case, a liquid can flow in the channel 5 more smoothly.

FIGS. 19(a) and 19(b) are a partially broken-away front view and a partially broken-away plan view illustrating another example of the geometric relationship of a channel and a pressure sensing face 108a of a pressure sensor 108.

As depicted in FIGS. 19(a) and 19(b) the pressure sensing face 108a of the pressure sensor 108 is a plane parallel to the z axis direction and the x axis direction. As depicted in FIG. 19(b), there is a space 5s1 large in the width direction of the channel 5, i.e., the y axis direction. However, as depicted in FIGS. 19(a) to 19(c), the pressure sensing face 108a extends vertically, in other words, it forms an angle of 90° with the horizontal plane. Therefore, even if a liquid with a high viscosity remains in the space 5s1, it readily flows downward in the channel by gravitation. Accordingly, exchange to a new liquid can be performed easily and quickly by arranging the pressure sensing face 108a of the pressure sensor 108 as described above.

Like the modified example depicted in FIG. 19(d), it is preferred also in this embodiment that the inner surfaces of corner parts 5d11, 5d12 in the transverse cross section of the channel 5 are rounded.

As depicted in FIG. 20, the angle θ between the pressure sensing face 108a and the horizontal plane is not limited to 90° and may be larger than 90°. That is, if the angle θ is within the range of 20° to 160°, the liquid attaching to the pressure sensing face 108a readily flows downward by gravitation even if the liquid has a high viscosity. Accordingly, exchange to a new, highly viscous liquid can be performed easily and quickly as in the above-described embodiment.

FIG. 21 is a schematic front cross-sectional view illustrating still another example of the geometric relationship of a channel and a pressure sensor.

In the portion to which the pressure sensor 108 is attached, the channel 5 is extended to form an angle of inclination θa with respect to the horizontal plane. That is, the direction F in which the channel 5 extends has an angle θa with respect to the horizontal plane. Here, a cylindrical connection part 5e is formed integrally with the channel 5. The cylindrical connection part 5e is provided to eject outward from the channel 5. A pressure sensor 108 is formed inside the cylindrical connection part Se. A pressure sensing face 108a of the pressure sensor 108 is retreated into the cylindrical connection part Se with respect to an inner channel surface 5g. Accordingly, there is a space 5s forward of the pressure sensing face 108a. On the other hand, the pressure sensing face 108a is arranged to form an angle θa with the direction F in which the channel 5 extends. Accordingly, the residual liquid attaching to the tip of the pressure sensing face 108a flows downward more easily as the angle θa becomes larger. That is, it joins in the channel 5 and can be moved from the tip of the pressure sensing face 108a together with a new liquid. Accordingly, also in this embodiment, exchange to a new liquid can be performed easily and quickly.

Although it is preferred that the angle θa approaches 90°, exchange to a new liquid can be performed easily and quickly as in this embodiment as long as the angle θa is within the range of 90° to 160°.

Accordingly, the pressures of a liquid just before supplying to the head 3 and just after ejection can be detected with the pressure sensor 108 and the pressure sensor 117.

Owing to the configuration as described above, since provision of the pressure sensors 108, 117 hardly allows a previous highly viscous liquid to remain forward of the pressure sensing faces of the pressure sensors at the start of printing, the liquid, if remains, can be moved into the channel 5 quickly. Accordingly, an operation of exchange to a new liquid can be performed easily and quickly.

The liquid heating devices 60, 60A have been described as a heating means in the embodiment described above, but a liquid heating device as another heating means may be used in the liquid ejection device of the present invention. FIGS. 22(a) to 22(c) are a front view, a plan view, and a right side view for explaining a modified example of a liquid heating device.

This liquid heating device 60B has a heating unit 71 and a channel tube 72, which is wound reverse spirally on the outer surface of the heating unit 71. The heating unit 71 is preferably made of a material excellent in thermal conductivity. Accordingly, metal, such as stainless steel, is preferably used. The heating unit 71 has a plate-like shape having a longitudinal direction. In the longitudinal direction of the heating unit 71, a plurality of heat medium channels 71a, 71b are provided from one end toward the other end. In the heat medium channels 71a, 71b is passed a heat medium heated at a prescribed temperature. A heating element may be provided instead of these heat medium channels 71a, 71b.

The liquid heating device 60B has fewer convection sites such as a folded part (a corner part where straight lines intersect) as compared with the liquid heating devices 60, 60A, and therefore it is preferable because gas bubbles are removed easily at the start of circulation or because convection of an ink for a long time can prevent a degraded material from attaching.

In order to adjust the surface area per unit volume (specific surface area) to 1.15 mm$^2$/mm$^3$ or more, the diameter is adjusted to 3.48 mm or less in the case of a cylindrical tube.

In order to increase the surface area per unit volume (specific surface area) in the absence of folded parts (corner parts where straight lines intersect), it is also preferred to make a cross section substantially elliptic.

The channel tube 72 is connected to a channel of a liquid ejection device. The curable composition previously described or a liquid to be heated is flowed through this channel tube 72.

Since the channel tube 72 is wound reverse spirally around the outer periphery of the heating unit 71, the liquid heating device 60B can have an enlarged contact area of the channel tube 72 and the heating unit 71. Accordingly, the liquid which flows in the channel tube 72 can be heated rapidly.

The channel tube 72 is also preferably made of a material excellent in thermal conductivity such as metal.

In another embodiment of the liquid heating device 60B, it is also preferred to put a channel tube 72 into a device containing therein a heat medium, such as oil. In this embodiment, the heat medium is heated by another heat source put in a container containing the heat medium. It is preferred that the heat medium is stirred and heat exchange is performed rapidly across the surface of the channel tube 72.

In still another embodiment of the liquid heating device 60B, it is also preferred to provide a heating source outside the channel tube 72 from the viewpoint of preventing heat from escaping outside.

DESCRIPTION OF REFERENCE SYMBOLS

1 . . . Liquid ejection device
2 . . . First tank
3 . . . Head
4 . . . First heating means
5 . . . First channel
5$d$1 to 5$d$10 . . . Corner part
5$e$ . . . Connection part
5$g$ . . . Inner channel surface
5$s$ . . . Space
5$x$ . . . Inner channel surface
5$z$ . . . Inner channel surface
6 . . . Second heating means
7 . . . Second channel
8 . . . Second pump
9 . . . First pump
10 . . . Switching valve
11 . . . Second tank
12 . . . Third channel
13 . . . Third pump
31 . . . Light-illuminating device
32 . . . Light source
40 . . . Heater
60 . . . Liquid heating device
60A . . . Liquid heating device
60B . . . Liquid heating device
61 . . . Thermal conductor
61$a$ . . . Recess
61A, 61B . . . Thermally conductive plate
62 . . . Heater
64 . . . Groove
64$c$, 64$d$ . . . Side surface
64$b$ . . . Bottom surface
64$e$ . . . Rear surface
64A . . . Straight part
64B . . . Folded part
64C . . . Partition part
64X . . . Channel
65 . . . Inlet port
65A . . . Supplying tube
66 . . . Outlet port
66A . . . Discharging tube
67 . . . Fixing means
68 . . . Sealing member
71 . . . Heating unit
71$a$, 71$b$ . . . Heat medium channel
72 . . . Channel tube

The invention claimed is:

1. A liquid ejection device comprising:
a first tank for retaining a liquid composition;
an inkjet head including a plurality of nozzles for ejecting the liquid composition;
a first heater for heating the liquid composition retained within the first tank;
a first channel for supplying the liquid composition from the first tank to the head;
a second heater for heating the liquid composition passing through the first channel;
a second channel for returning the liquid composition from the head to the first tank;
a pump connected to the first channel or the second channel and pumping the liquid composition; and
a controller,
wherein the controller is configured to control the first heater to have a first heating temperature of 40° C. or higher, and
wherein the controller is configured to control the second heater to have a second heating temperature that is 65° C. or less more than the first heating temperature and is 45° C. or higher and 110° C. or less.

2. The liquid ejection device according to claim 1, wherein the liquid composition is a curable composition that is cured by the application of heat.

3. The liquid ejection device according to claim 1, wherein the liquid composition is a curable composition that is cured by the application of heat or the irradiation with light.

4. The liquid ejection device according to claim 1, wherein a switching valve selectively switchable between supply of the liquid composition passing through the first channel to the head and supply of the liquid composition passing through the first channel to the second channel is provided downstream of the second heater of the first channel.

5. The liquid ejection device according to claim 1, wherein said pump comprises a first pump and a second pump connected to the first channel and the second channel, respectively.

6. The liquid ejection device according to claim 1, further comprising a second tank to supply the liquid composition to the first tank.

7. The liquid ejection device according to claim 6, wherein the temperature difference between the heating temperature of the second heater and the heating temperature of the first heater is not less than 5° C. and not more than 65° C.

8. The liquid ejection device according to claim 7, wherein the heating temperature of the first heater is not higher than 90° C.

9. The liquid ejection device according to claim 1, wherein the temperature difference between the lowest temperature of a temperature range providing a viscosity range of the liquid composition in which the liquid composition is capable of being ejected and the heating temperature of the second heater is 30° C. or less.

10. The liquid ejection device according to claim 1, wherein the viscosity of the liquid composition at the time of being ejected from the head is not lower than 3 mPa·s and not higher than 100 mPa·s.

11. The liquid ejection device according to claim 1, wherein a surface area per unit volume of the channel heated by the second heater is 1.15 mm$^2$/mm$^3$ or more.

12. The liquid ejection device according to claim 1, further comprising a buffer tank being connected to the channels and having an upper surface and a lower surface, wherein the channels have first and second tubing segments connected to the buffer tank, the second tubing segment is connected to the lower surface of the buffer tank, the first tubing segment is extended into the buffer tank, and an end of the first tubing segment is located above an end of the second tubing segment connected to the buffer tank.

13. The liquid ejection device according to claim 12, wherein the lower surface of the buffer tank has a projecting part that projects downward, and the second tubing segment is connected to the projecting part.

14. The liquid ejection device according to claim 1, further comprising a pressure sensor for detecting the pressure of the liquid composition in at least one of the first and second channels, the pressure sensor being connected to the at least one of the first and second channels, wherein the pressure sensor has a pressure sensing face, and the pressure sensing face is located within a range up to 1 mm from a same plane as an inner channel surface of a channel part, to which the pressure sensor is attached, to an outside from the inner channel surface.

15. The liquid ejection device according to claim 1, wherein the liquid composition comprises a photocurable compound, a photo or thermo curable compound, a thermocurable compound, a photopolymerization initiator, and a thermal curing agent.

* * * * *